US011148708B2

(12) United States Patent
Morimoto et al.

(10) Patent No.: US 11,148,708 B2
(45) Date of Patent: Oct. 19, 2021

(54) ELECTRONIC CONTROL DEVICE AND STEERING DEVICE

(71) Applicant: NSK LTD., Tokyo (JP)

(72) Inventors: Masakazu Morimoto, Tokyo (JP); Noboru Kaneko, Tokyo (JP)

(73) Assignee: NSK LTD., Tokyo (JP)

( * ) Notice: Subject to any disclaimer, the term of this patent is extended or adjusted under 35 U.S.C. 154(b) by 102 days.

(21) Appl. No.: 16/349,079

(22) PCT Filed: Oct. 19, 2017

(86) PCT No.: PCT/JP2017/037850
§ 371 (c)(1),
(2) Date: May 10, 2019

(87) PCT Pub. No.: WO2018/088162
PCT Pub. Date: May 17, 2018

(65) Prior Publication Data
US 2019/0276072 A1    Sep. 12, 2019

(30) Foreign Application Priority Data

Nov. 11, 2016   (JP) .............................. JP2016-220800
Sep. 20, 2017   (JP) .............................. JP2017-180232

(51) Int. Cl.
*B62D 5/04*          (2006.01)
*H05K 7/20*          (2006.01)
(Continued)

(52) U.S. Cl.
CPC ............ *B62D 5/0406* (2013.01); *H01G 2/08* (2013.01); *H01G 2/106* (2013.01);
(Continued)

(58) Field of Classification Search
CPC .. H05K 7/2089; H05K 7/209; H05K 7/20454; H02K 11/33; B25D 5/0406;
(Continued)

(56) References Cited

U.S. PATENT DOCUMENTS 5,373,418 A      12/1994  Hayasi
5,894,402 A *     4/1999  Strange .................... H01G 9/08
                                                            361/514
(Continued)

FOREIGN PATENT DOCUMENTS

CN        201215770 Y      4/2009
CN        101932488 A     12/2010
(Continued)

OTHER PUBLICATIONS

English machine translation, Uno et al. DE102015219476 A1 (Year: 2016).*
(Continued)

*Primary Examiner* — Burton S Mullins
(74) *Attorney, Agent, or Firm* — Sughrue Mion, PLLC

(57) ABSTRACT

An electronic control device includes: a circuit board including a substrate and an electrolytic capacitor connected to the substrate; a heat sink including a recess that houses the electrolytic capacitor; and heat dissipation material provided in the recess. The electrolytic capacitor has an end surface facing a bottom surface of the recess, and the heat dissipation material is in contact with the end surface and the bottom surface.

6 Claims, 22 Drawing Sheets

(51) Int. Cl.
*H02K 11/33* (2016.01)
*H01G 9/022* (2006.01)
*H01G 9/26* (2006.01)
*H01G 9/00* (2006.01)
*H01G 9/06* (2006.01)
*H01G 2/10* (2006.01)
*H01G 2/08* (2006.01)

(52) U.S. Cl.
CPC ........... *H01G 9/0003* (2013.01); *H01G 9/022* (2013.01); *H01G 9/06* (2013.01); *H01G 9/26* (2013.01); *H02K 11/33* (2016.01); *H05K 7/209* (2013.01); *H05K 7/2039* (2013.01); *H05K 7/20454* (2013.01)

(58) Field of Classification Search
CPC ........ H01G 2/08; H01G 2/106; H01G 9/0003; H01G 9/022; H01G 9/06; H01G 9/26; H01K 7/2039
See application file for complete search history.

(56) References Cited

U.S. PATENT DOCUMENTS

| | | | | |
|---|---|---|---|---|
| 6,656,389 | B2* | 12/2003 | Iruvanti | H01C 1/084 |
| | | | | 216/17 |
| 7,375,287 | B2* | 5/2008 | Rathmann | H05K 1/144 |
| | | | | 174/257 |
| 7,880,411 | B2* | 2/2011 | Nagase | B62D 5/0457 |
| | | | | 318/139 |
| 8,184,438 | B2* | 5/2012 | Kaneko | H05K 7/026 |
| | | | | 361/705 |
| 8,755,170 | B2* | 6/2014 | Mori | H01G 9/145 |
| | | | | 361/502 |
| 9,058,932 | B2* | 6/2015 | Ebersberger | H01G 4/224 |
| 9,088,196 | B2* | 7/2015 | Nakano | H02K 11/33 |
| 9,338,925 | B2* | 5/2016 | Nakano | H05K 7/2039 |
| 2007/0241303 | A1* | 10/2007 | Zhong | C08K 9/04 |
| | | | | 252/62.3 T |
| 2010/0006798 | A1* | 1/2010 | Endo | C09K 5/14 |
| | | | | 252/78.3 |
| 2010/0295498 | A1 | 11/2010 | Tominaga et al. | |
| 2012/0229005 | A1 | 9/2012 | Tominaga et al. | |
| 2012/0313467 | A1 | 12/2012 | Omae et al. | |
| 2013/0088128 | A1 | 4/2013 | Nakano et al. | |
| 2014/0035445 | A1* | 2/2014 | Uryu | H02K 11/33 |
| | | | | 310/68 D |
| 2016/0212882 | A1 | 7/2016 | Maier | |
| 2019/0115806 | A1* | 4/2019 | Yamashita | H02K 5/225 |

FOREIGN PATENT DOCUMENTS

| | | | | |
|---|---|---|---|---|
| CN | 102763309 | A | 10/2012 | |
| CN | 102812623 | A | 12/2012 | |
| CN | 103153754 | A | 6/2013 | |
| CN | 105813435 | A | 7/2016 | |
| DE | 102015219476 | A1 * | 1/2016 | ............. H02K 11/00 |
| JP | 3-278596 | A | 12/1991 | |
| JP | 6-62527 | U | 9/1994 | |
| JP | 2000-253626 | A | 9/2000 | |
| JP | 2005-174950 | A | 6/2005 | |
| JP | 2009-246170 | A | 10/2009 | |
| WO | 2009/093331 | A1 | 7/2009 | |
| WO | 2011/114554 | A1 | 9/2011 | |
| WO | 2011/142050 | A1 | 11/2011 | |
| WO | 2012/056735 | A1 | 5/2012 | |

OTHER PUBLICATIONS

Communication dated Jul. 9, 2019, from the Japanese Patent Office in counterpart Application No. 2018-550105.
International Search Report for PCT/JP2017/037850 dated Jan. 16, 2018 [PCT/ISA/210].
Communication dated Nov. 11, 2019, from the European Patent Office in application No. 17868662.2.
Search Report dated Oct. 29, 2019 from the European Patent Office in application No. 17868662.2.
Communication dated Aug. 31, 2020 from the China National Intellectual Property Administration in Application No. 201780069623.6.

* cited by examiner

| | A: HEAT-RESISTANCE TEMPERATURE (°C) | EMBODIMENT (WITH HEAT DISSIPATION MATERIAL) | | COMPARATIVE EXAMPLE (WITHOUT HEAT DISSIPATION MATERIAL) | | C-B (°C) |
|---|---|---|---|---|---|---|
| | | B: MAXIMUM TEMPERATURE (°C) IN 60 MINUTES | A-B (°C) | C: MAXIMUM TEMPERATURE (°C) IN 60 MINUTES | A-C (°C) | |
| FIRST ELECTROLYTIC CAPACITOR | 125 | 98.4 | 26.6 | 109.7 | 15.3 | 11.3 |
| SECOND ELECTROLYTIC CAPACITOR | 125 | 102.4 | 22.6 | 124.9 | 0.1 | 22.5 |
| THIRD ELECTROLYTIC CAPACITOR | 125 | 105.8 | 19.2 | 144.8 | -19.8 | 39.0 |

402A  401A

401A

ELECTRONIC CONTROL DEVICE AND STEERING DEVICE

CROSS REFERENCE TO RELATED APPLICATIONS

This application is a National Stage of PCT international application Ser. No. PCT/JP2017/037850 filed on Oct. 19, 2017, which designates the United States, incorporated herein by reference, and which is based upon and claims the benefit of priority from Japanese Patent Application No. 2016-220800 filed on Nov. 11, 2016, and Japanese Patent Application No. 2017-180232 filed on Sep. 20, 2017, the entire contents of which are incorporated herein by reference.

BACKGROUND

1. Technical Field

The present invention relates to an electronic control device and a steering device.

2. Description of the Related Art

A steering device configured to generate assist steering torque by an electric motor is provided with an electronic control device configured to control the electric motor. Because the electronic control device is disposed near an engine compartment, the temperature around the electronic control device is high. Heat generated by electronic components mounted in the electronic control device increases as the power of the motor increases. In particular, the heat-resistance temperature of an electrolytic capacitor is lower than the heat-resistance temperature of other electronic components such as a semiconductor element and a resistor. Consequently, a structure for promoting heat dissipation of the electrolytic capacitor is required. For example, Prior Art 1 discloses a control device having a heat dissipation adhesive between a capacitor and a housing portion provided to a housing cover.

PRIOR ART

Prior Art 1: Japanese Patent Application Laid-open No. 2009-246170

In the conventional technology, however, heat dissipation efficiency of the electrolytic capacitor may be insufficient in some cases. For this reason, a structure capable of further improving the heat dissipation efficiency of the electrolytic capacitor has been desired.

The present disclosure has been made in view of the above-mentioned problem, and is directed to providing an electronic control device and a steering device that are capable of improving heat dissipation efficiency of an electrolytic capacitor.

SUMMARY

Solution to Problem

According to an aspect of the present disclosure in order to achieve the above-mentioned purpose, an electronic control device includes: a circuit board including a substrate and an electrolytic capacitor connected to the substrate; a heat sink including a recess that houses the electrolytic capacitor; and heat dissipation material provided in the recess. The electrolytic capacitor has an end surface facing a bottom surface of the recess, and the heat dissipation material is in contact with the end surface and the bottom surface.

With this configuration, heat generated by the electrolytic capacitor is transferred to the heat sink through the end surface. Accordingly, for example, as compared with the case where the heat dissipation material is in contact with the outer peripheral surface of the electrolytic capacitor covered with a sleeve, the amount of heat transferred to the heat sink tends to be large. Consequently, the electronic control device can improve heat dissipation efficiency of the electrolytic capacitor.

As a preferred aspect of the electronic control device, the heat dissipation material is preferably in contact with the entire end surface. With this configuration, the heat dissipation efficiency of the electrolytic capacitor is further improved.

As a preferred aspect of the electronic control device, the recess has a side surface along an outer peripheral surface of the electrolytic capacitor, and the heat dissipation material is in contact with the end surface, the outer peripheral surface, the bottom surface, and the side surface. With this configuration, the heat dissipation efficiency of the electrolytic capacitor is further improved.

As a preferred aspect of the electronic control device, the heat sink includes a concave curved surface that is a curved surface connecting the bottom surface and the side surface. With this configuration, when the electrolytic capacitor is housed in the recess, the heat dissipation material more easily moves toward an edge of the recess (toward an inlet of the recess).

As a preferred aspect of the electronic control device, in a cross-section of the electrolytic capacitor and the heat sink cut along a plane parallel to the end surface, a width of a gap between the outer peripheral surface and the side surface is constant. With this configuration, because the thickness of the heat dissipation material is made uniform, heat is transmitted to the heat sink uniformly over the entire circumference of the electrolytic capacitor. As a result, the heat dissipation efficiency of the electrolytic capacitor is more easily improved, and hence the amount of the heat dissipation material used for obtaining predetermined heat dissipation efficiency is further reduced.

As a preferred aspect of the electronic control device, the electrolytic capacitor includes an explosion-proof valve on the end surface. With this configuration, the heat dissipation material covers the explosion-proof valve. Because the heat dissipation material has adhesion properties, even when the explosion-proof valve is opened due to expansion of an electrolytic solution, the heat dissipation material covers at least a part of the end surface. Consequently, the electronic control device can suppress scattering of the electrolytic solution when the explosion-proof valve is opened due to the expansion of the electrolytic solution.

According to another aspect of the present disclosure, a steering device includes: the electronic control device; and an electric motor controlled by the electronic control device to generate assist steering torque. With this configuration, the steering device can suppress a temperature increase in the electrolytic capacitor even when the electric motor has high power.

Advantageous Effects of Invention

According to the present disclosure, the electronic control device and the steering device capable of improving heat dissipation efficiency of an electrolytic capacitor can be provided.

DETAILED DESCRIPTION

The present invention will be described in detail below with reference to the drawings. The following modes for carrying out the invention (hereinafter referred to as "embodiments") are not intended to limit the present invention. Components described below include components easily conceivable by those skilled in the art and components substantially identical therewith. Furthermore, the components described below may be appropriately combined.

First Embodiment

Figure 1:
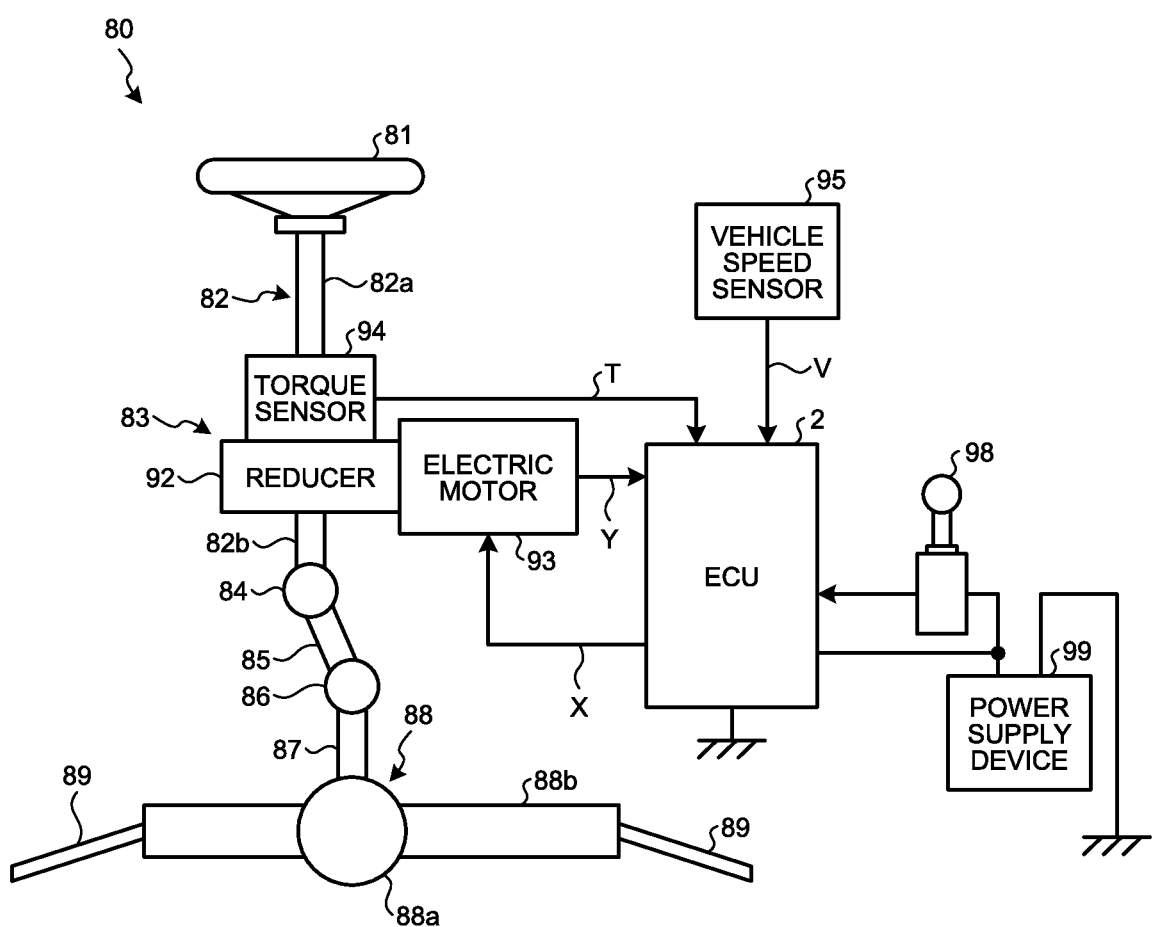
FIG. 1 is a schematic diagram illustrating the outline of a steering device according to a first embodiment.

FIG. 1 is a schematic view illustrating the outline of a steering device according to a first embodiment. A steering device 80 is an electric power steering device. As illustrated in FIG. 1, the steering device 80 includes a steering wheel 81, a steering shaft 82, a steering force assist mechanism 83, a universal joint 84, a lower shaft 85, and a universal joint 86 in order of transmission of force applied from an operator, and is bonded to a pinion shaft 87. The steering device 80 includes an electronic control unit (ECU) 2 as an electronic control device, and a torque sensor 94. A vehicle speed sensor 95 is provided to a vehicle body, and outputs a vehicle speed signal V to the ECU2 by controller area network (CAN) communication.

As illustrated in FIG. 1, the steering shaft 82 includes an input shaft 82a and an output shaft 82b. One end portion of the input shaft 82a is connected to the steering wheel 81, and the other end portion of the input shaft 82a is connected to the output shaft 82b. One end portion of the output shaft 82b is connected to the input shaft 82a, and the other end portion of the output shaft 82b is connected to the universal joint 84. In the first embodiment, the input shaft 82a and the output shaft 82b are formed from general steel, such as carbon steel for machine structural use (SC material) and carbon steel tubes for machine structural purposes (what is called STKM material).

As illustrated in FIG. 1, the lower shaft 85 is a member connected to the output shaft 82b through the universal joint 84. One end portion of the lower shaft 85 is connected to the universal joint 84, and the other end portion thereof is connected to the universal joint 86. One end portion of the pinion shaft 87 is connected to the universal joint 86, and the other end portion of the pinion shaft 87 is connected to a steering gear 88.

As illustrated in FIG. 1, the steering gear 88 includes a pinion 88a and a rack 88b. The pinion 88a is connected to the pinion shaft 87. The rack 88b is engaged with the pinion 88a. The steering gear 88 converts rotational motion transmitted to the pinion 88a into linear motion of the rack 88b. The rack 88b is connected to a tie rod 89. The steering device 80 is of a rack-and-pinion type.

As illustrated in FIG. 1, the steering force assist mechanism 83 includes a reducer 92 and an electric motor 93. The electric motor 93 is, for example, a brushless motor. The reducer 92 is, for example, a worm reducer. Torque generated by the electric motor 93 is transmitted to a worm wheel through a worm inside the reducer 92, and rotates the worm wheel. The reducer 92 uses the worm and the worm wheel to increase torque generated by the electric motor 93. The reducer 92 applies assist steering torque to the output shaft 82b. The steering device 80 is of a column assist type.

The torque sensor 94 detects steering force of the operator transmitted to the input shaft 82a through the steering wheel 81 as steering torque. The vehicle speed sensor 95 detects traveling speed (vehicle speed) of the vehicle body on which the steering device 80 is mounted. The electric motor 93, the torque sensor 94, and the vehicle speed sensor 95 are electrically connected to an ECU 2.

The ECU 2 is a device configured to control the operation of the electric motor 93. When an ignition switch 98 is on, electric power is supplied to the ECU 2 from a power supply device (for example, in-vehicle battery) 99. The ECU 2 acquires signals from the torque sensor 94 and the vehicle speed sensor 95. Specifically, the ECU 2 acquires steering torque T from the torque sensor 94, and acquires a vehicle speed signal V of a vehicle body from the vehicle speed sensor 95. The ECU 2 calculates an assist steering command value of an assist command based on the steering torque T and the vehicle speed signal V. The ECU 2 adjusts an electric power value X supplied to the electric motor 93 based on the calculated assist steering command value. The ECU 2 acquires information on an inductive voltage from the electric motor 93 or information output from a resolver provided to the electric motor 93 as operating information Y.

The steering force of an operator (driver) input to the steering wheel 81 is transmitted to the reducer 92 in the steering force assist mechanism 83 through the input shaft 82a. In this case, the ECU 2 acquires the steering torque T input to the input shaft 82a from the torque sensor 94, and acquires the vehicle speed signal V from the vehicle speed sensor 95. The ECU 2 controls the operation of the electric motor 93. The assist steering torque produced by the electric motor 93 is transmitted to the reducer 92.

The steering torque (including assist steering torque) output through the output shaft 82b is transmitted to the lower shaft 85 through the universal joint 84, and further transmitted to the pinion shaft 87 through the universal joint 86. The steering force transmitted to the pinion shaft 87 is transmitted to the tie rod 89 through the steering gear 88 to displace wheels.

Figure 2:
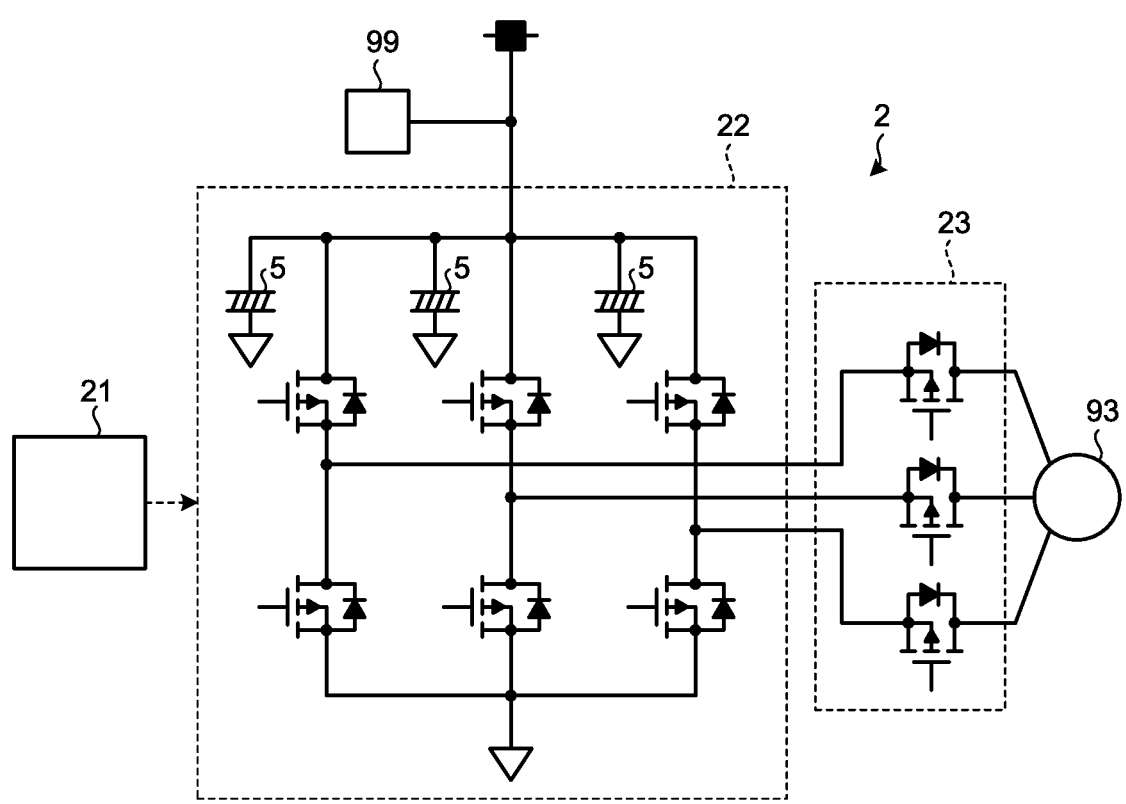
FIG. 2 is a schematic diagram illustrating the outline of an ECU according to the first embodiment.
Figure 3:
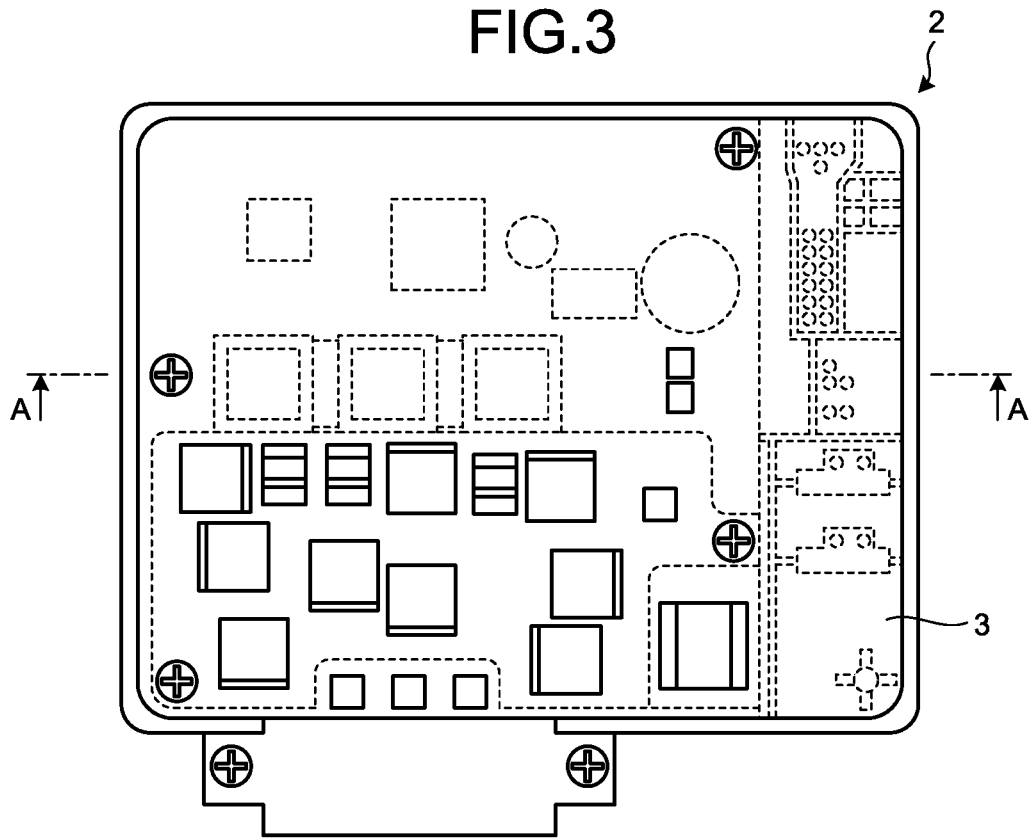
FIG. 3 is a plan view of an electronic control device according to the first embodiment.
Figure 4:
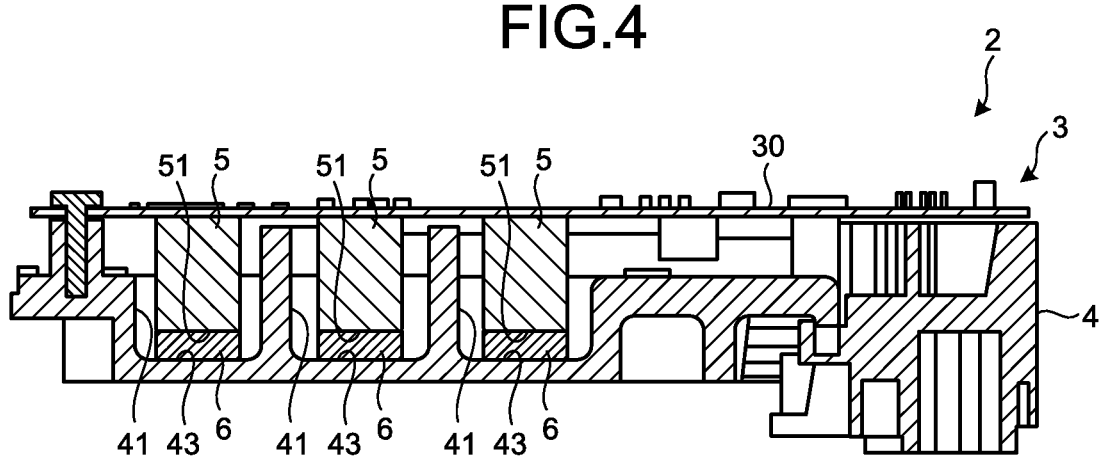
FIG. 4 is a cross-sectional view taken along line A-A in FIG. 3.
Figure 5:
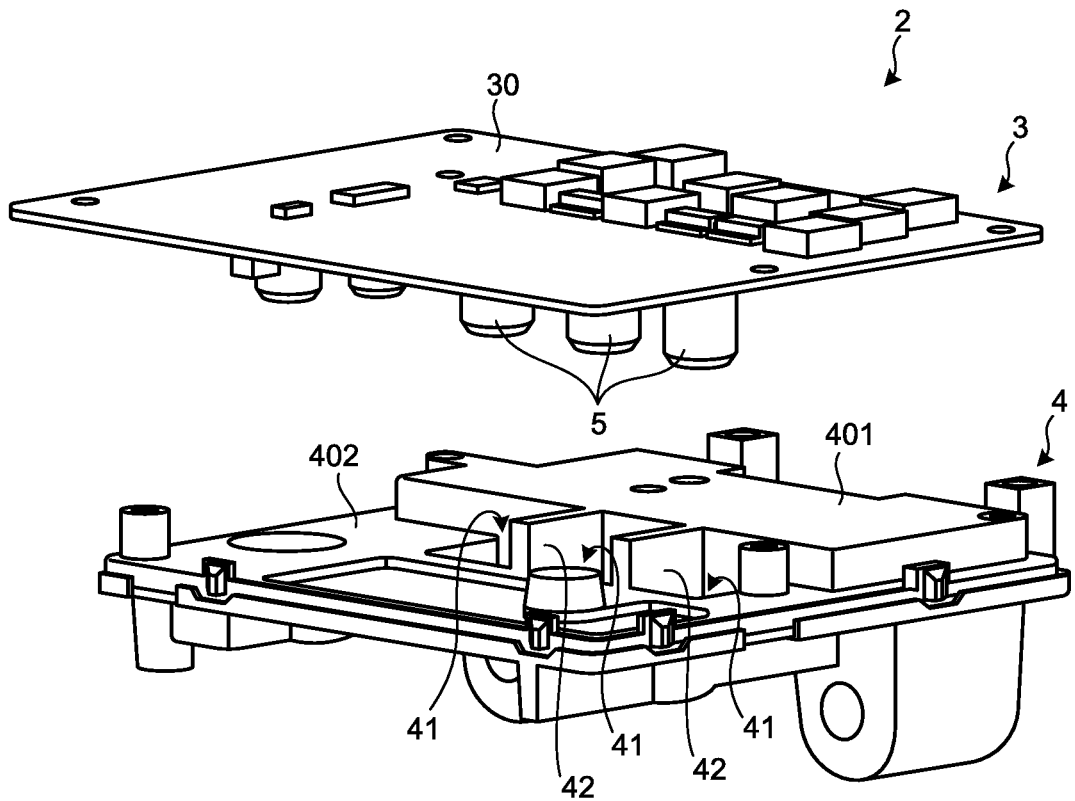
FIG. 5 is an exploded perspective view of the electronic control device according to the first embodiment.
Figure 6:
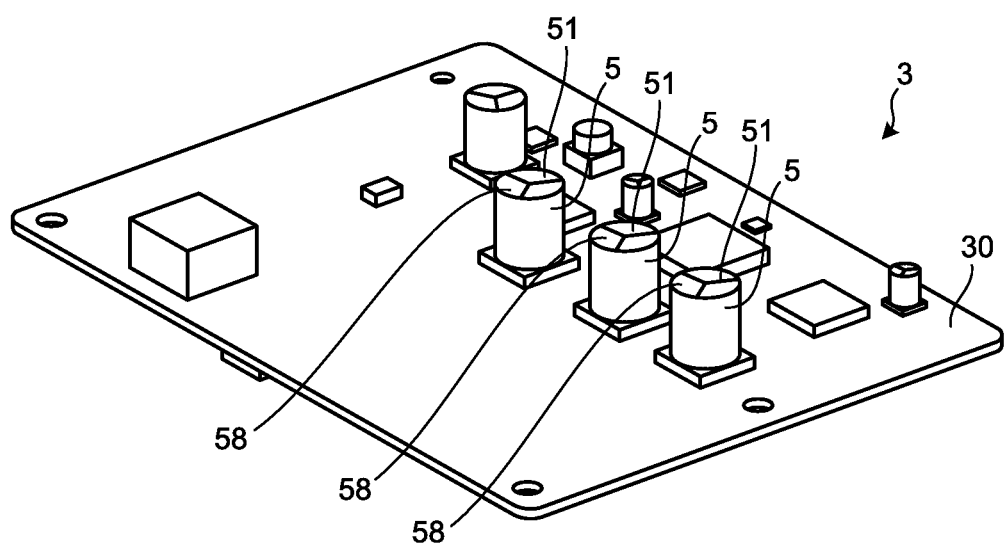
FIG. 6 is a perspective view of a circuit board according to the first embodiment.
Figure 7:
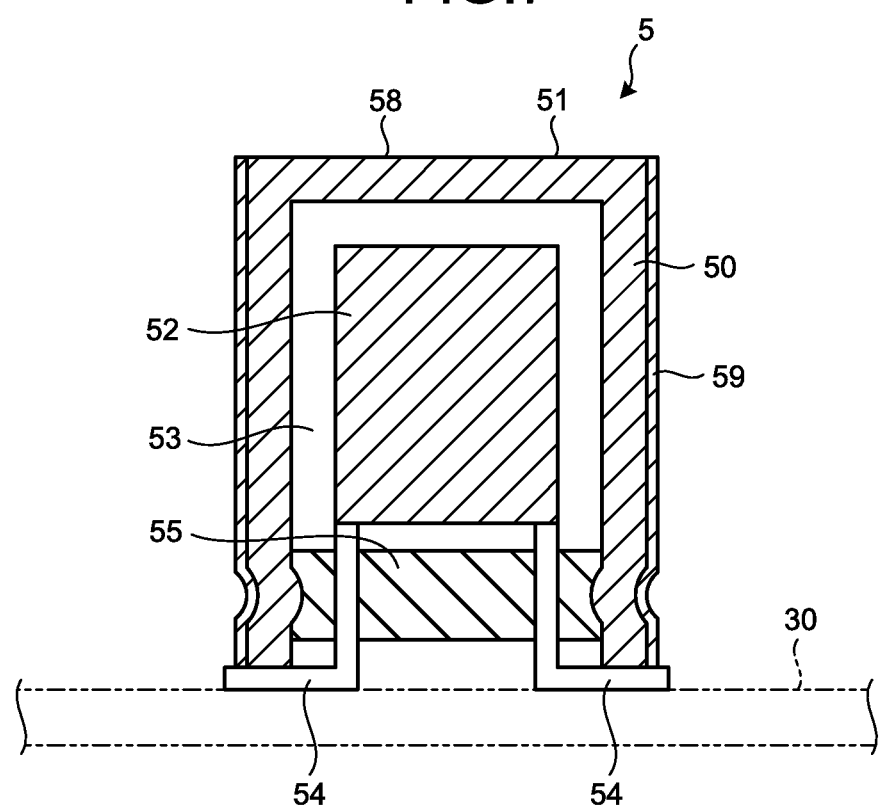
FIG. 7 is a cross-sectional view of an electrolytic capacitor according to the first embodiment.
Figure 8:
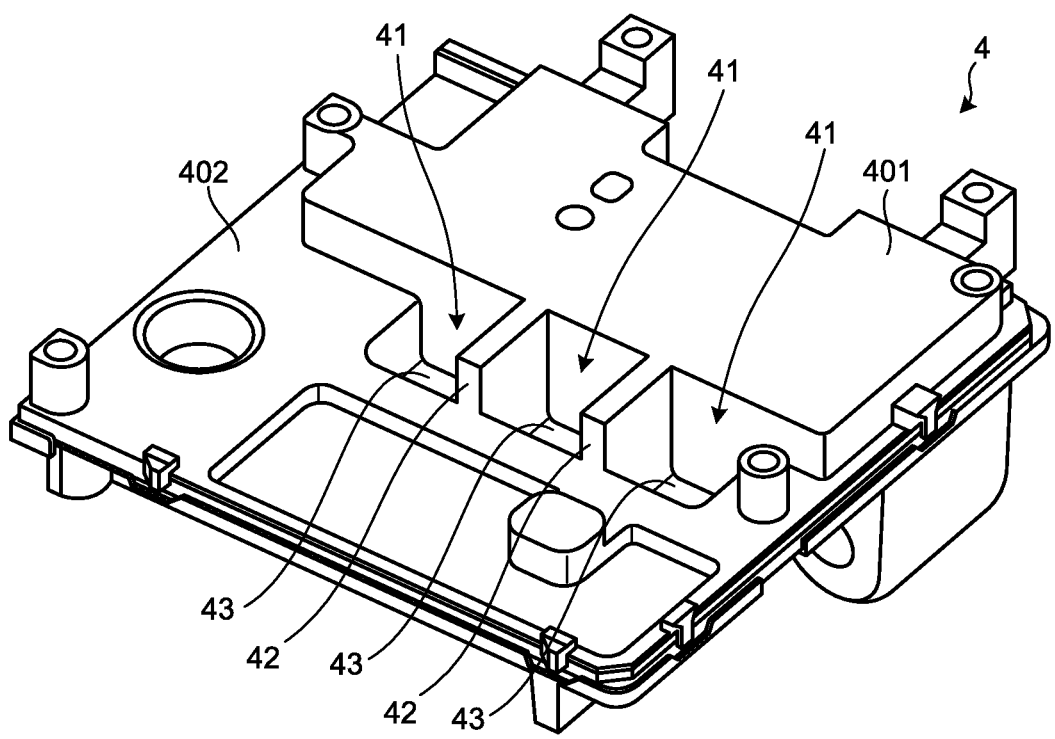
FIG. 8 is a perspective view of a heat sink according to the first embodiment.

FIG. 2 is a schematic diagram illustrating the outline of the ECU according to the first embodiment. FIG. 3 is a plan view of the electronic control device according to the first embodiment. FIG. 4 is a cross-sectional view taken along line A-A in FIG. 3. FIG. 5 is an exploded perspective view of the electronic control device according to the first embodiment. FIG. 6 is a perspective view of the circuit board according to the first embodiment. FIG. 7 is a cross-sectional view of an electrolytic capacitor according to the first embodiment. FIG. 8 is a perspective view of a heat sink according to the first embodiment.

As illustrated in FIG. 2, the ECU 2 includes a motor driving control unit 21, an inverter 22, and a motor relay circuit 23. The motor driving control unit 21 calculates a current command value based on the steering torque T and the vehicle speed signal V, and transmits a pulse width modulation (PWM) signal to the inverter 22 based on the current command value. The inverter 22 switches ON and OFF field-effect transistors based on a pulse width modulation signal received from the motor driving control unit 21, and generates three-phase current. The inverter 22 is supplied with electric power from the power supply device 99. The inverter 22 is provided with, for example, three electrolytic capacitors 5 described later as smoothing capacitors. Three-phase alternating current generated by the inverter 22 is supplied to the electric motor 93 through the motor relay circuit 23. A diode is connected in parallel to the field-effect transistor. When a gate of the field-effect transistor is OFF, the current can flow in one direction; and when the gate is ON, the current can flow in two directions. In the steering device 80, a direction in which the steering wheel 81 is rotated and speed at which the steering wheel 81 is rotated frequently change. When steering is assisted (when the electric motor 93 generates assist steering torque), current flowing from the inverter 22 toward the electric motor 93 is generated. When the assist of the steering is unnecessary, on the other hand, current (regenerative current) flowing from the electric motor 93 toward the inverter 22 is generated. Furthermore, when the rack 88b has moved by the maximum distance, the rack 88b comes into contact with a viscoelastic stopper so that the movement of the rack 88b is restricted. When the rack 88b comes into contact with the stopper, the current to the electric motor 93 is stopped. Consequently, in the electric motor 93 used for the steering device 80, the supply and stop of the current and the change of the direction of the current are repeated. The electrolytic capacitor 5 frequently repeats charging and discharging in order to smooth the change in current of the electric motor 93. For this reason, the temperature of the electrolytic capacitor 5 used for the steering device 80 tends to be high, and thus the heat dissipation of the electrolytic capacitor 5 needs to be promoted.

As illustrated in FIG. 5, the ECU 2 includes a circuit board 3 and a heat sink 4. The ECU 2 includes a cover that covers the circuit board 3, which is not illustrated in the drawings. For example, the cover is formed from metal such as an electrolytic zinc-coated steel sheet.

The circuit board 3 includes a substrate 30 and a plurality of electronic components mounted on the substrate 30. The substrate 30 is, for example, a printed substrate formed from resin. The substrate 30 has mounted thereon a plurality of electronic components constituting a control circuit and a plurality of electronic components constituting a power supply circuit. The circuit board 3 serves as both a control circuit board and a power supply circuit board.

If the substrate 30 is made of metal, heat generated by the electronic component dissipates through the substrate 30 to some extent. Because the substrate 30 is made of resin, on the other hand, heat generated by the electronic component needs to be transferred to the heat sink 4 in order to prevent an excessive temperature increase in the electronic component.

As illustrated in FIG. 5 and FIG. 6, the circuit board 3 includes three electrolytic capacitors 5 as electronic components. The three electrolytic capacitors 5 are mounted on one surface of the circuit board 3 and arranged in the same straight line.

The electrolytic capacitor 5 is, for example, a lead aluminum electrolytic capacitor, and is formed into a columnar shape as illustrated in FIG. 7. The axial direction of the columnar electrolytic capacitor 5 is orthogonal to the substrate 30. As illustrated in FIG. 7, the electrolytic capacitor 5 includes a case 50, a sleeve 59, an element 52, an electrolytic solution 53, a lead wire 54, a sealing material 55, and an explosion-proof valve 58.

The case 50 is made of aluminum alloy and formed into a substantially cylindrical shape, and has the element 52 and the electrolytic solution 53 built therein. An end surface 51 of the electrolytic capacitor 5 (end surface of case 50) is along the surface of the substrate 30. As illustrated in FIG. 7, the end surface 51 is located on an end portion of the case 50 on the opposite side of an end portion on which the lead wire 54 and the sealing material 55 are disposed. The outer peripheral surface of the case 50 is covered with the sleeve 59. For example, the sleeve 59 is polyvinyl chloride. Heat conductivity of the sleeve 59 is lower than heat conductivity of the case 50. The explosion-proof valve 58 is, for example, a substantially Y-shaped cut (slit) provided in the end surface 51. The explosion-proof valve 58 is opened when the element 52 and the electrolytic solution 53 excessively expand.

For example, the element 52 is formed by winding anode foil and cathode foil partitioned by electrolytic paper around an axis orthogonal to the end surface 51. The anode foil and the cathode foil in the element 52 are, for example, aluminum foil. The element 52 is immersed in the electrolytic solution 53. The lead wire 54 is connected to the element 52 and protrudes outside the case 50. The lead wire 54 is connected to the substrate 30. The sealing material 55 closes the end portion on the opposite side of the end surface 51, thereby preventing leakage of the electrolytic solution 53. The electrolytic solution 53 may contain conductive polymer in a solid state. An aluminum electrolytic capacitor having an electrolytic solution 53 containing conductive polymer is called "conductive polymer hybrid aluminum electrolytic capacitor". The conductive polymer hybrid aluminum electrolytic capacitor has the same structure as the structure of the electrolytic capacitor 5 illustrated in FIG. 7, except that the conductive polymer hybrid aluminum electrolytic capacitor has the electrolytic solution 53 containing conductive polymer.

The heat sink 4 is a member configured to dissipate heat generated by the circuit board 3. The heat sink 4 is, for example, made of metal such as an aluminum alloy, and formed by die-casting. For example, the heat sink 4 is mounted on the outer peripheral surface of the electric motor 93. As illustrated in FIG. 8, the heat sink 4 has a step, and includes an upper stage portion 401 disposed on one side of the step and a lower stage portion 402 disposed on the other side of the step.

The heat sink 4 includes three recesses 41 in the lower stage portion 402. Adjacent two recesses 41 are partitioned by a partition wall 42. The three recesses 41 correspond to the respective three electrolytic capacitors 5. Specifically, the three recesses 41 are arranged in the same straight line, and an interval between adjacent two recesses 41 is equal to a distance between adjacent two electrolytic capacitors 5. As illustrated in FIG. 4, a bottom surface 43 of the recess 41 is a flat surface along the substrate 30. As illustrated in FIG. 4, the circuit board 3 is mounted to the heat sink 4 such that the end surface 51 of the electrolytic capacitor 5 faces the bottom surface 43 of the recess 41. In this manner, at least a part of the electrolytic capacitor 5 is housed in the recess 41. Consequently, the thickness of the ECU 2 can be reduced. The end surface 51 of the electrolytic capacitor 5 facing the bottom surface 43 of the recess 41 makes it harder for the electrolytic solution 53 to be scattered even when the explosion-proof valve 58 is opened.

A heat dissipation material 6 is a material for promoting the transfer of heat generated by the circuit board 3 to the heat sink 4. The heat dissipation material 6 is, for example, a material obtained by mixing heat conductive filler in silicone polymer. The heat dissipation material 6 is called a "thermal interface material (TIM)". The heat dissipation material 6 is, for example, in a paste form, and is in contact with the end surface 51 and the bottom surface 43 of the recess 41 as illustrated in FIG. 4. Specifically, the heat dissipation material 6 is in contact with the entire end surface 51.

The heat dissipation material 6, which has heat conductivity higher than that of air, is in contact with the end surface 51 and the bottom surface 43, whereby the heat dissipation efficiency is improved as compared with the case where the heat dissipation material 6 is absent. Further, the end surface 51 is not covered with the sleeve 59, and the heat conductivity of the case 50 is higher than the heat conductivity of the sleeve 59. Accordingly, the contact of the heat dissipation material 6 with the end surface 51 improves the heat dissipation efficiency as compared with the case where the heat dissipation material 6 is in contact with the outer peripheral surface of the sleeve 59. As a result, the electrolytic capacitor 5 is prevented from being overheated even when charging and discharging of the electrolytic capacitor 5 are frequently repeated as described above.

As described above, in the element 52 in the electrolytic capacitor 5, the electrolytic paper, the anode foil, and the cathode foil are wound around the axis orthogonal to the end surface 51. A distance from a center part of the element 52 to the end surface 51 is substantially the same as a distance from an outer peripheral part of the element 52 to the end surface 51. Accordingly, the contact of the heat dissipation material 6 with the end surface 51 allows not only heat generated at the outer peripheral part of the element 52 but also heat generated at the center part of the element 52 to easily dissipate. If the heat dissipation material 6 is in contact with the outer peripheral surface of the sleeve 59, heat generated at the outer peripheral part of the element 52 dissipates, but heat generated at the center part of the element 52 hardly dissipates. Furthermore, the contact of the heat dissipation material 6 with the outer peripheral surface of the sleeve 59 promotes heat dissipation on one side of the electrolytic capacitor 5, thereby possibly causing temperature bias inside the electrolytic capacitor 5. In the first embodiment, on the other hand, the contact of the heat dissipation material 6 with the end surface 51 improves the heat dissipation efficiency, and prevents temperature bias inside the electrolytic capacitor 5.

As an example of the arrangement of the heat dissipation material 6, the heat dissipation material 6 may possibly be disposed such that heat of the electrolytic capacitor 5 is transferred to a cover of the ECU 2. Specifically, when the heat dissipation material 6 is disposed between the cover of the ECU 2 and the end surface 51, the heat of the electrolytic capacitor 5 is transferred to the cover. The cover needs to be made of metal in order to promote the heat dissipation of the electrolytic capacitor 5. In the case where the heat of the electrolytic capacitor 5 is transferred to the cover, the heat sink 4, the substrate 30, the electrolytic capacitor 5, and the cover are arranged in this order. A gap larger than the height of the electrolytic capacitor 5 is necessary between the substrate 30 and the cover. For this reason, such a configuration promotes the heat dissipation of the electrolytic capacitor 5, but causes a problem in that the thickness of the ECU 2 tends to be large.

In the first embodiment, on the other hand, the heat of the electrolytic capacitor 5 is transferred to the heat sink 4, and hence a material lighter than metal, such as resin, can be employed as the material of the cover of the ECU 2. Accordingly, the ECU 2 is reduced in weight. In the first embodiment, the electrolytic capacitor 5 is housed in the recess 41 in the heat sink 4, and the heat dissipation material 6 is disposed between the end surface 51 and the bottom surface 43. Accordingly, the thickness of the ECU 2 is more easily reduced. As a result, the ECU 2 is more easily mounted on a vehicle. Further, the heat dissipation material 6 being housed in the recess 41 prevents leakage of the heat dissipation material 6 from the ECU 2.

Figures 9, 10:
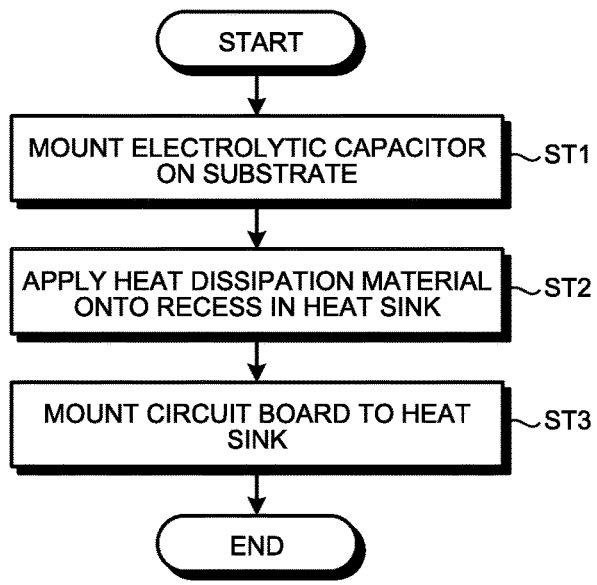
FIG. 9 is a diagram illustrating experimental results of the electronic control device according to the first embodiment in comparison with a comparative example.
FIG. 10 is a flowchart illustrating a method of manufacturing an electronic control device according to the first embodiment.

FIG. 9 is a diagram illustrating experimental results of the electronic control device according to the first embodiment in comparison with a comparative example. The comparative example is different from the first embodiment in not having the heat dissipation material 6. In the experiment, current was caused to flow through three electrolytic capacitors 5 continuously for 60 minutes. The maximum temperature in 60 minutes illustrated in FIG. 9 is the maximum value of the surface temperature of the electrolytic capacitor 5. A first electrolytic capacitor illustrated in FIG. 9 is an electrolytic capacitor 5 disposed on the rightmost side in FIG. 4. A second electrolytic capacitor illustrated in FIG. 9 is an electrolytic capacitor 5 in the middle in FIG. 4. A third electrolytic capacitor illustrated in FIG. 9 is an electrolytic capacitor 5 disposed on the leftmost side in FIG. 4.

Examples of the heat-resistance temperature set to the electrolytic capacitors include 85° C., 105° C., 125° C., and 140° C. The heat-resistance temperature of the electrolytic capacitors used in the experiment is 125° C. When the temperature of the electrolytic capacitor becomes equal to or higher than 125° C., which is the heat-resistance temperature, an overheat protection function of the electrolytic capacitor starts to operate, thereby restricting the current flowing through the electrolytic capacitor. In this case, performance required for the electrolytic capacitor may not be obtained. As illustrated in FIG. 9, in the comparative example without the heat dissipation material 6, the temperature of the third electrolytic capacitor exceeds the heat-resistance temperature. In particular, when the substrate on which the electrolytic capacitor is mounted is not made of metal but made of resin, the temperature of the electrolytic capacitor tends to increase. For this reason, the conventional technology requires countermeasures such as providing a via (through hole) for promoting heat dissipation in the substrate on which the electrolytic capacitor is mounted.

As illustrated in FIG. 9, the ECU 2 according to the first embodiment can reduce the temperature of the electrolytic capacitor 5 as compared with the comparative example without the heat dissipation material 6. Specifically, the temperature of the electrolytic capacitor 5 in the first embodiment is lower than that in the comparative example by at least 10° C. The maximum temperature of the electrolytic capacitor 5 may exceed the heat-resistance temperature in the comparative example, while the maximum temperature of any of the electrolytic capacitors 5 is lower than the heat-resistance temperature by 15° C. or more in the first embodiment. In this manner, the ECU 2 according to the first embodiment can maintain the temperature of the electrolytic capacitor 5 to be lower than the heat-resistance temperature even without a via, which is required in the conventional technology. This configuration eliminates the need for a step for forming a via in the substrate 30, which makes the manufacturing of the ECU2 according to the first embodiment easier than that of the conventional technology. As a result, the cost for manufacturing the ECU 2 is reduced.

Further, the temperature of electronic components disposed around the electrolytic capacitor 5 is maintained low, and hence the life of the electronic components is prolonged. The temperature difference among the three electrolytic capacitors 5 is small, and hence a fluctuation in a three-phase AC voltage supplied to the electric motor 93 is suppressed. As a result, torque ripple in the electric motor 93 is suppressed.

Figure 11:
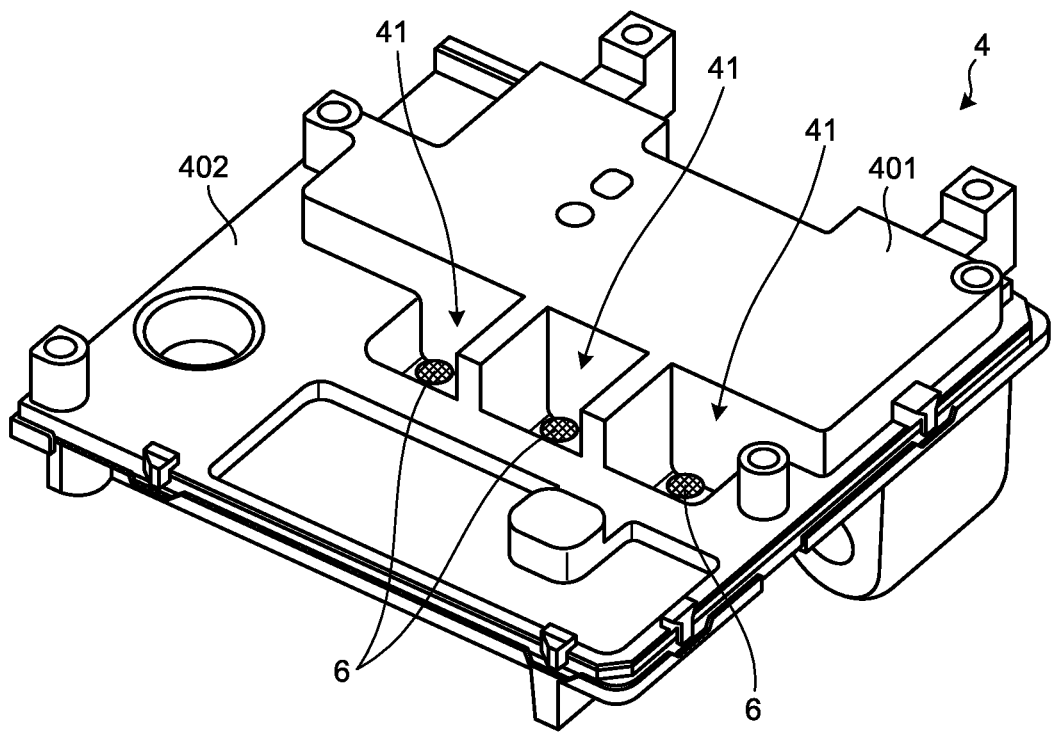
FIG. 11 is a perspective view of the heat sink in a process of manufacturing an electronic control device according to the first embodiment.
Figure 12:
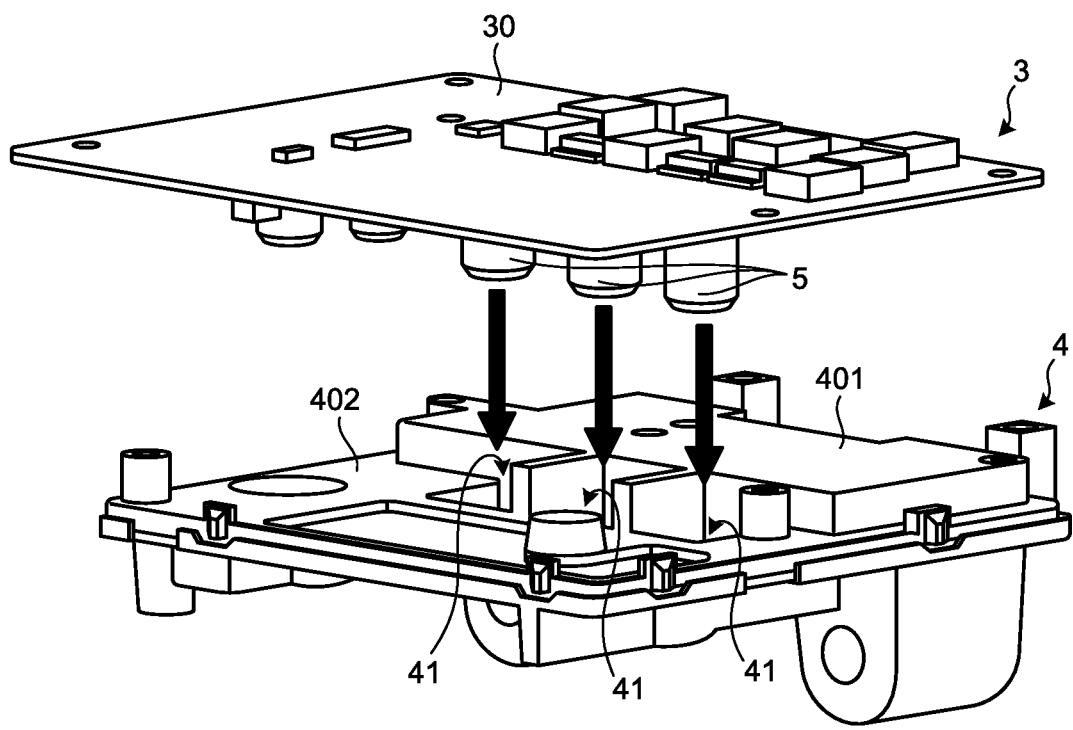
FIG. 12 is a perspective view illustrating the heat sink and the circuit board in the process of manufacturing an electronic control device according to the first embodiment.

FIG. 10 is a flowchart illustrating a method of manufacturing an electronic control device according to the first embodiment. FIG. 11 is a perspective view of the heat sink in a process of manufacturing an electronic control device according to the first embodiment. FIG. 12 is a perspective view illustrating the heat sink and the circuit board in the process of manufacturing an electronic control device according to the first embodiment.

In a step for assembling the circuit board 3 and the heat sink 4, first, the electrolytic capacitor 5 is mounted on the substrate 30 (Step ST1 in FIG. 10). The lead wire 54 of the electrolytic capacitor 5 is connected to the substrate 30 by solder or the like.

Following Step ST1, as illustrated in FIG. 11, the heat dissipation material 6 is applied onto the bottom surface 43 of the heat sink 4 (Step ST2 in FIG. 10). The application amount of the heat dissipation material 6 is adjusted such that the end surface 51 comes into contact with the bottom surface 43 of the recess 41 when the circuit board 3 is mounted to the heat sink 4. Specifically, the thickness of the heat dissipation material 6 applied onto the bottom surface 43 is larger than a gap between the end surface 51 and the bottom surface 43 of the recess 41 when the circuit board 3 is mounted to the heat sink 4. Step ST2 may be performed before Step ST1.

Following Step ST2, as illustrated in FIG. 12, the circuit board 3 is mounted to the heat sink 4 (Step ST3 in FIG. 10). The circuit board 3 is fixed to the heat sink 4, for example, by screws. After that, the cover is mounted to the heat sink 4 so as to cover the circuit board 3. The ECU 2 is then mounted to the outer peripheral surface of the electric motor 93. Wiring (harness) connected to a connector provided to the ECU 2 is connected to the electric motor 93.

The circuit board 3 is not necessarily required to serve as both a control circuit board and a power supply circuit board. For example, the circuit board 3 may be a power supply circuit board, and a control circuit board different from the circuit board 3 may be provided. In such a case, the circuit board 3 having the electrolytic capacitor 5 is disposed closer to the heat sink 4 than the control circuit board is to the heat sink 4.

The heat dissipation material 6 is not necessarily required to be in contact with the entire end surface 51. The heat dissipation material 6 only needs to be in contact with at least a part of the end surface 51. The heat dissipation material 6 is preferably in contact with at least the center of the end surface 51. The heat dissipation material 6 may be in contact not only with the end surface 51, but also with the outer peripheral surface of the electrolytic capacitor 5 (outer peripheral surface of sleeve 59).

As described above, the electronic control device (ECU 2) according to the first embodiment includes: the circuit board 3 having the substrate 30 and the electrolytic capacitor 5 connected to the substrate 30; the heat sink 4 having the recess 41 for housing the electrolytic capacitor 5; and the heat dissipation material 6 provided in the recess 41. The end surface 51 of the electrolytic capacitor 5 faces the bottom surface 43 of the recess 41. The heat dissipation material 6 is in contact with the end surface 51 and the bottom surface 43.

With this configuration, heat generated by the electrolytic capacitor 5 is transferred to the heat sink 4 through the end surface 51. Accordingly, as compared with the case where the heat dissipation material 6 is in contact with the outer peripheral surface of the electrolytic capacitor 5 covered with the sleeve 59, for example, the amount of heat transferred to the heat sink 4 tends to be large. Consequently, the electronic control device (ECU 2) according to the first embodiment can improve heat dissipation efficiency of the electrolytic capacitor 5.

The heat dissipation material 6 is in contact with the entire end surface 51. With this configuration, the heat dissipation efficiency of the electrolytic capacitor 5 is further improved.

The electrolytic capacitor 5 includes the explosion-proof valve 58 on the end surface 51. With this configuration, the heat dissipation material 6 covers the explosion-proof valve 58. Because the heat dissipation material 6 has adhesion properties, even when the explosion-proof valve 58 is opened due to expansion of the electrolytic solution 53, the heat dissipation material 6 covers at least a part of the end surface 51. Consequently, the electronic control device (ECU 2) can prevent scattering of the electrolytic solution 53 when the explosion-proof valve 58 is opened due to the expansion of the electrolytic solution 53.

The steering device 80 includes the electronic control device (ECU 2), and the electric motor 93 controlled by the electronic control device (ECU 2) to generate assist steering torque. With this configuration, the steering device 80 can suppress a temperature increase in the electrolytic capacitor 5 even when the electric motor 93 has high power.

Second Embodiment

Figure 13:
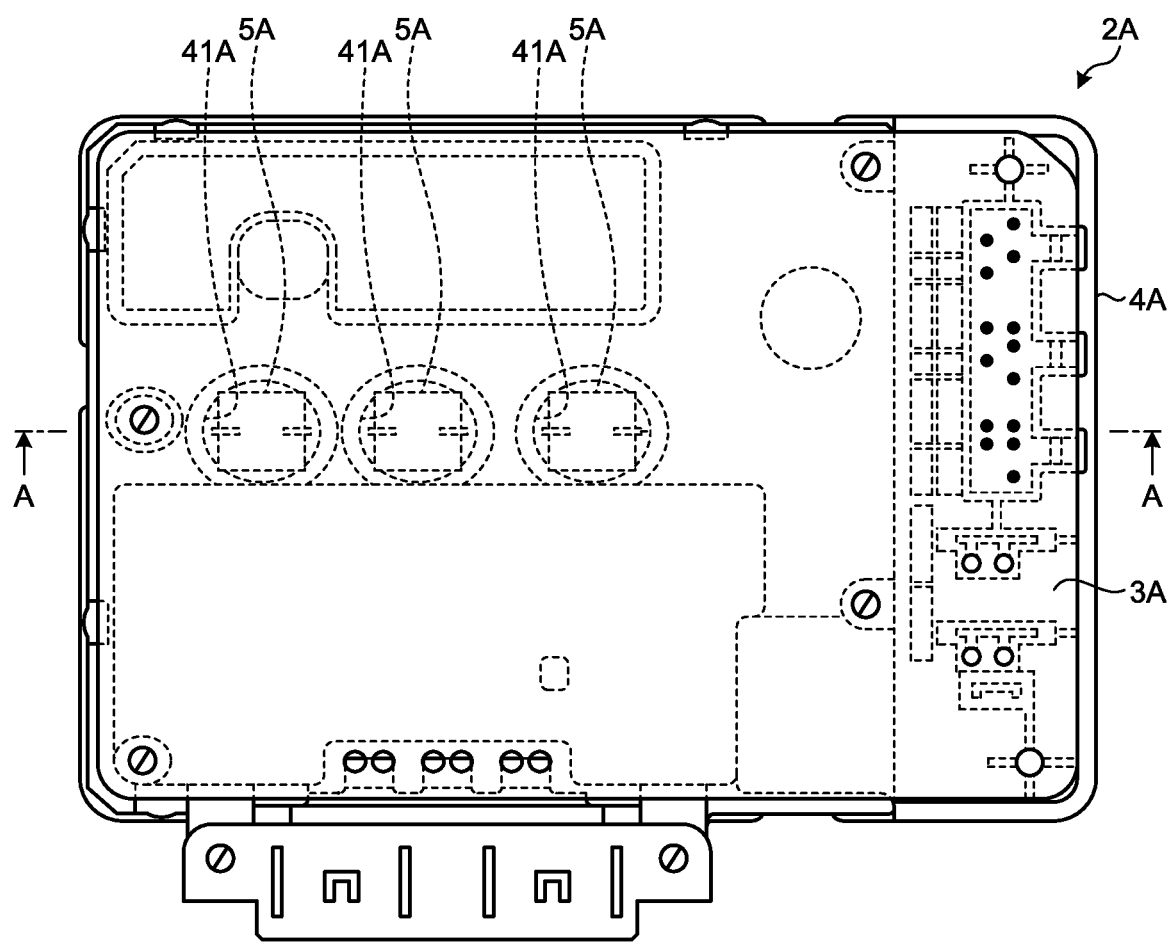
FIG. 13 is a front view of an electronic control device according to a second embodiment.
Figure 14:
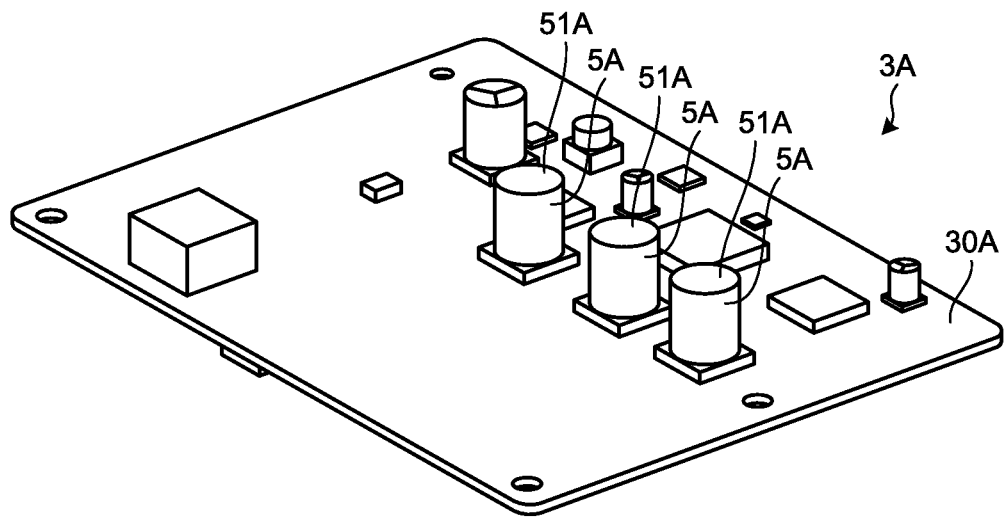
FIG. 14 is a perspective view of a circuit board according to the second embodiment.
Figure 15:
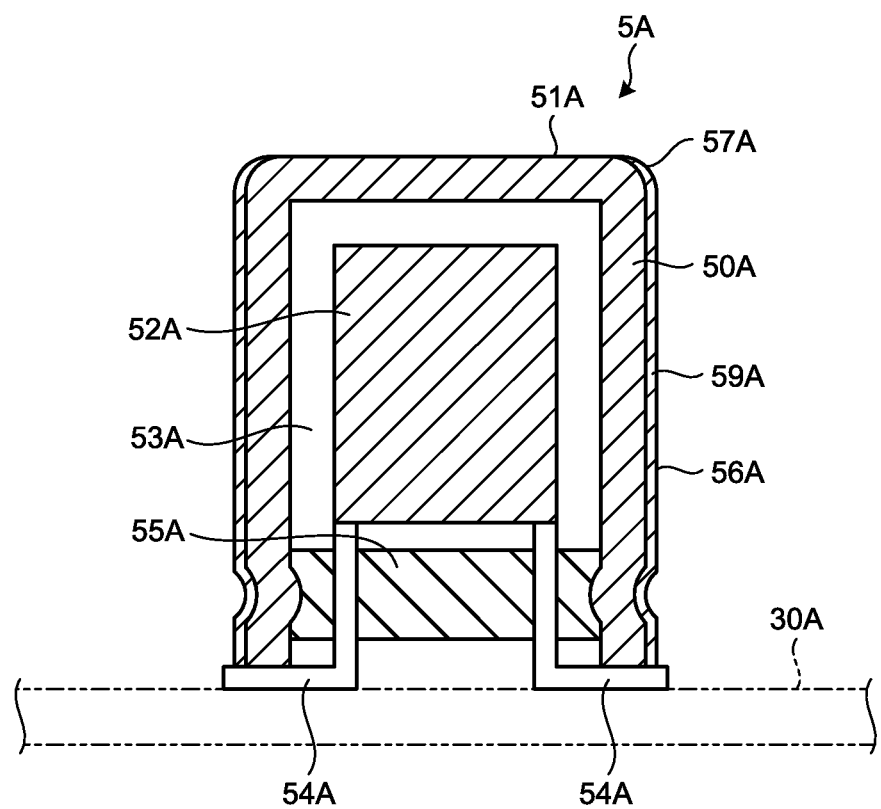
FIG. 15 is a cross-sectional view of an electrolytic capacitor according to the second embodiment.

FIG. 13 is a front view of an electronic control device according to a second embodiment. FIG. 14 is a perspective view of a circuit board according to the second embodiment. FIG. 15 is a cross-sectional view of an electrolytic capacitor according to the second embodiment.

As illustrated in FIG. 13, an ECU 2A includes a circuit board 3A and a heat sink 4A. The ECU 2A includes a cover that covers the circuit board 3A, which is not illustrated in the drawings. For example, the cover is formed from metal such as an electrolytic zinc-coated steel sheet.

The circuit board 3A includes a substrate 30A and a plurality of electronic components mounted on the substrate 30A. For example, the substrate 30A is formed from the same material as that of the above-mentioned substrate 30.

As illustrated in FIG. 14, the circuit board 3A includes three electrolytic capacitors 5A as electronic components. The three electrolytic capacitors 5A are mounted on one surface of the circuit board 3A and arranged in the same straight line.

The electrolytic capacitor 5A is, for example, a lead aluminum electrolytic capacitor, and is formed into a columnar shape as illustrated in FIG. 15. The axial direction of the columnar electrolytic capacitor 5A is orthogonal to the substrate 30A. As illustrated in FIG. 15, the electrolytic capacitor 5A includes a case 50A, a sleeve 59A, an element 52A, an electrolytic solution 53A, a lead wire 54A, and a sealing material 55A. The electrolytic capacitor 5A in the second embodiment does not include an explosion-proof valve. For example, the above descriptions of the element 52, the electrolytic solution 53, the lead wire 54, and the sealing material 55 can be applied to the element 52A, the electrolytic solution 53A, the lead wire 54A, and the sealing material 55A, respectively.

The case 50A is made of an aluminum alloy and formed into a substantially cylindrical shape, and has the element 52A and the electrolytic solution 53A built therein. An end surface 51A of the electrolytic capacitor 5A (end surface of case 50A) is a flat surface along the substrate 30A. As illustrated in FIG. 15, the end surface 51A is located on an end portion of the case 50A on the opposite side of an end portion on which the lead wire 54A and the sealing material 55A are disposed. The outer peripheral surface of the case 50A is covered with the sleeve 59A. The sleeve 59A is, for example, polyvinyl chloride. Heat conductivity of the sleeve 59A is lower than heat conductivity of the case 50A. An outer peripheral surface 56A of the electrolytic capacitor 5A illustrated in FIG. 15 is the outer peripheral surface of the sleeve 59A. The outer peripheral surface 56A is a cylindrical curved surface. As illustrated in FIG. 15, the electrolytic capacitor 5A includes a convex curved surface 57A connecting the end surface 51A and the outer peripheral surface 56A. In a cross-section including an axis of the electrolytic capacitor 5A (straight line passing through the center of the end surface 51A and perpendicular to the end surface 51A) (cross-section illustrated in FIG. 15), the convex curved surface 57A forms into an arc. The curvature radius of the arc formed by the convex curved surface 57A is, for example, 0.5 mm.

Figure 16:
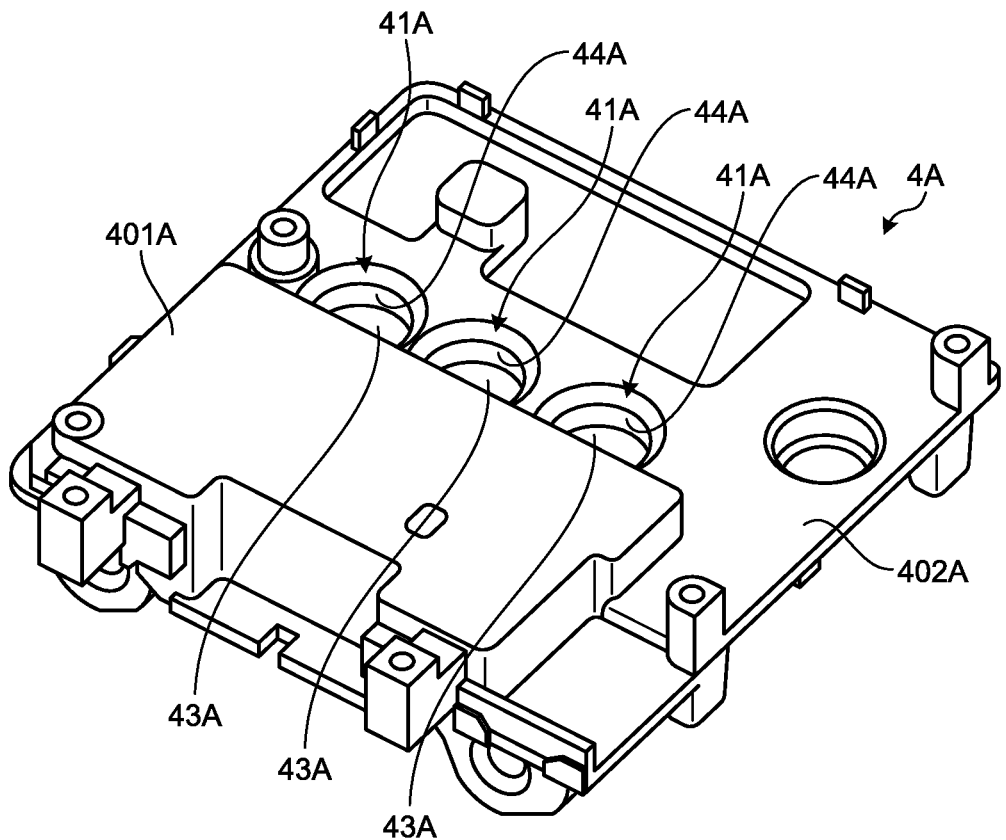
FIG. 16 is a perspective view of a heat sink according to the second embodiment.
Figure 17:
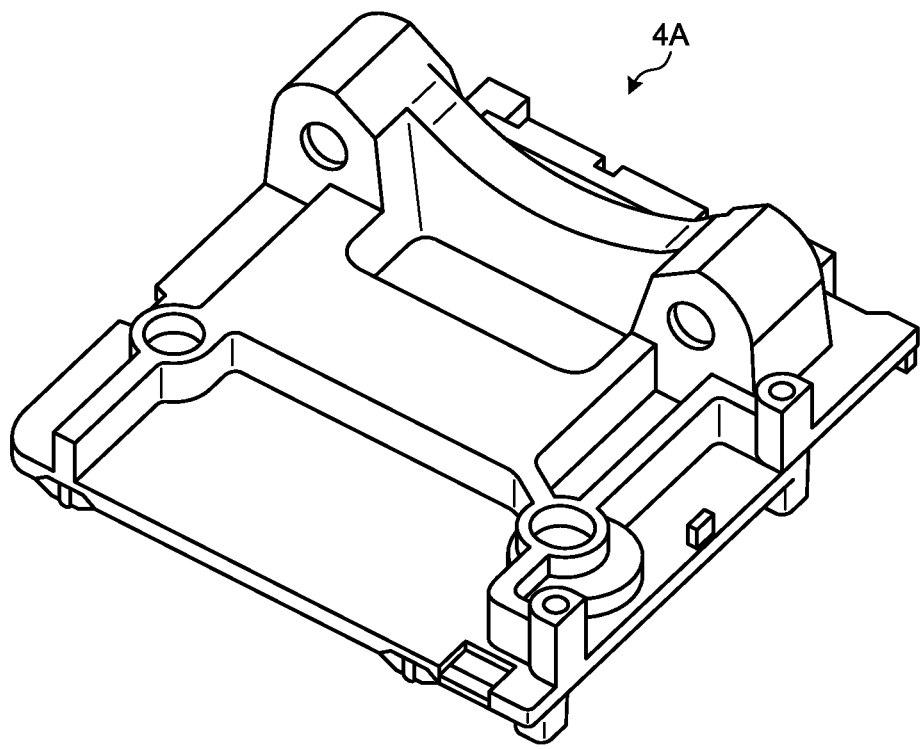
FIG. 17 is a perspective view of the heat sink according to the second embodiment.
Figure 18:
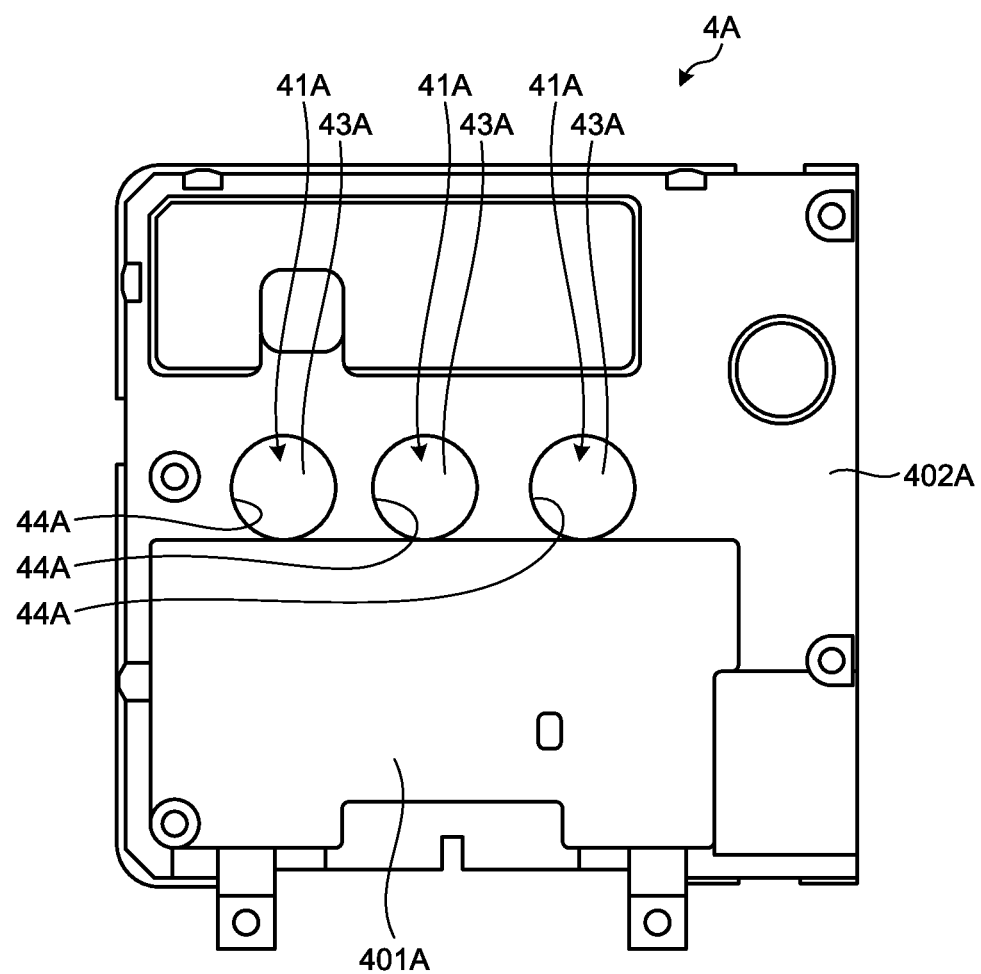
FIG. 18 is a front view of the heat sink according to the second embodiment.
Figure 19:
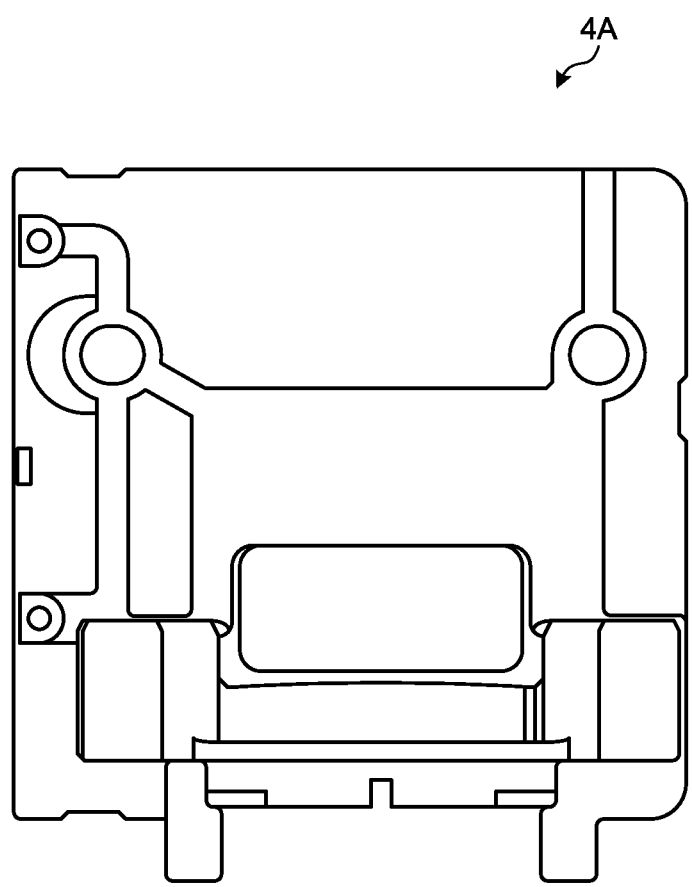
FIG. 19 is a rear view of the heat sink according to the second embodiment.
Figure 20:
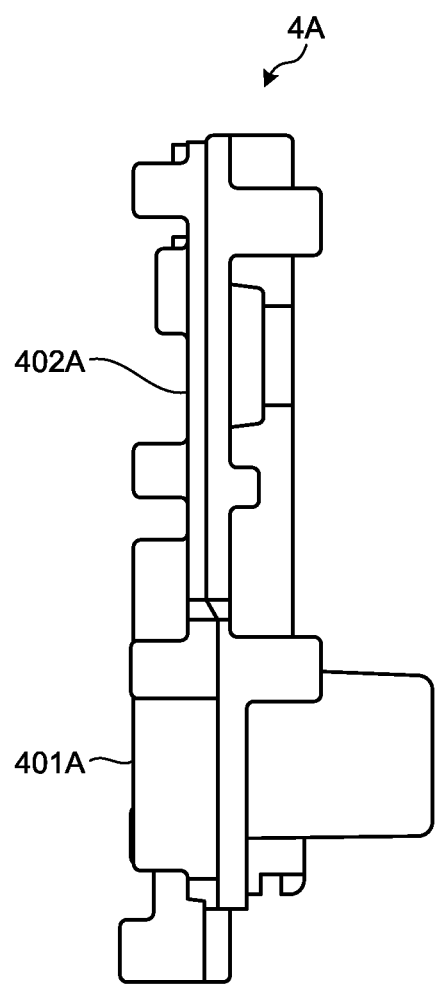
FIG. 20 is a right side view of the heat sink according to the second embodiment.
Figure 21:
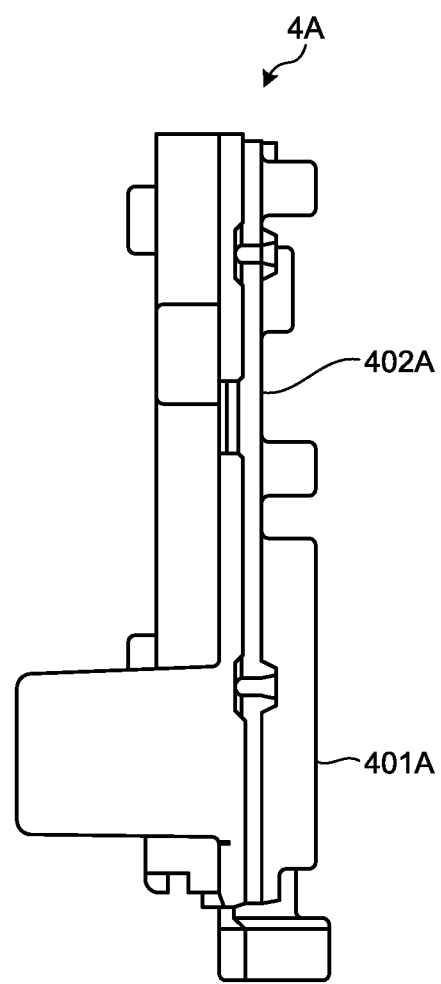
FIG. 21 is a left side view of the heat sink according to the second embodiment.
Figure 22:
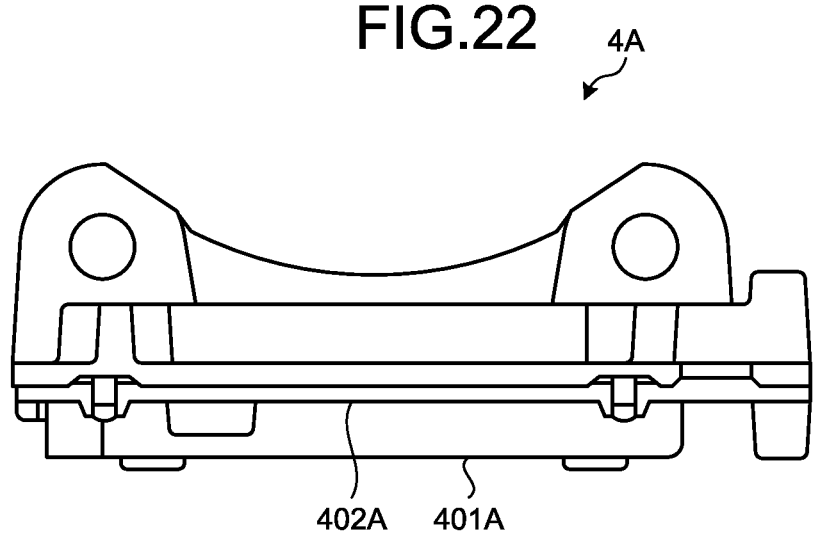
FIG. 22 is a plan view of the heat sink according to the second embodiment.
Figure 23:
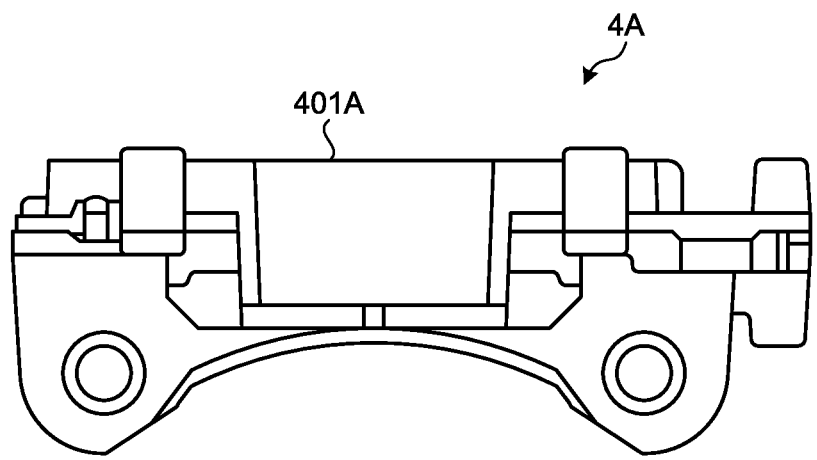
FIG. 23 is a bottom view of the heat sink according to the second embodiment.
Figure 24:
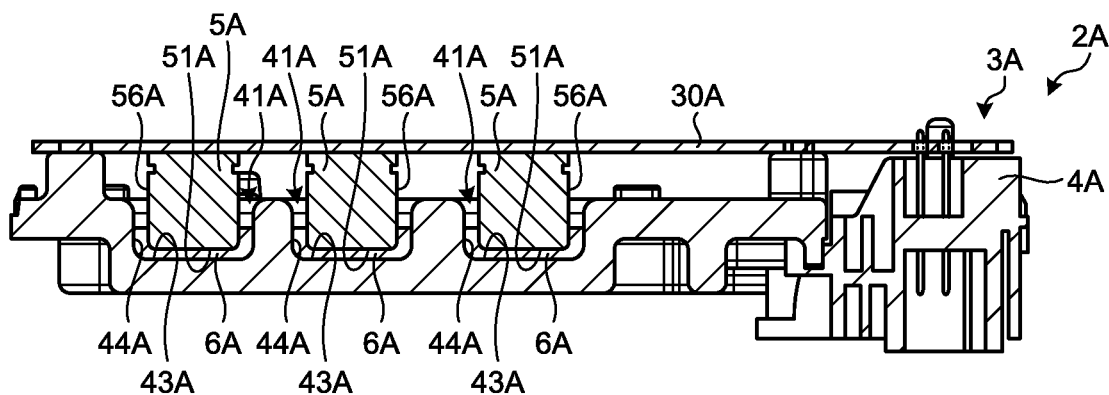
FIG. 24 is a cross-sectional view taken along line A-A in FIG. 13.
Figure 25:
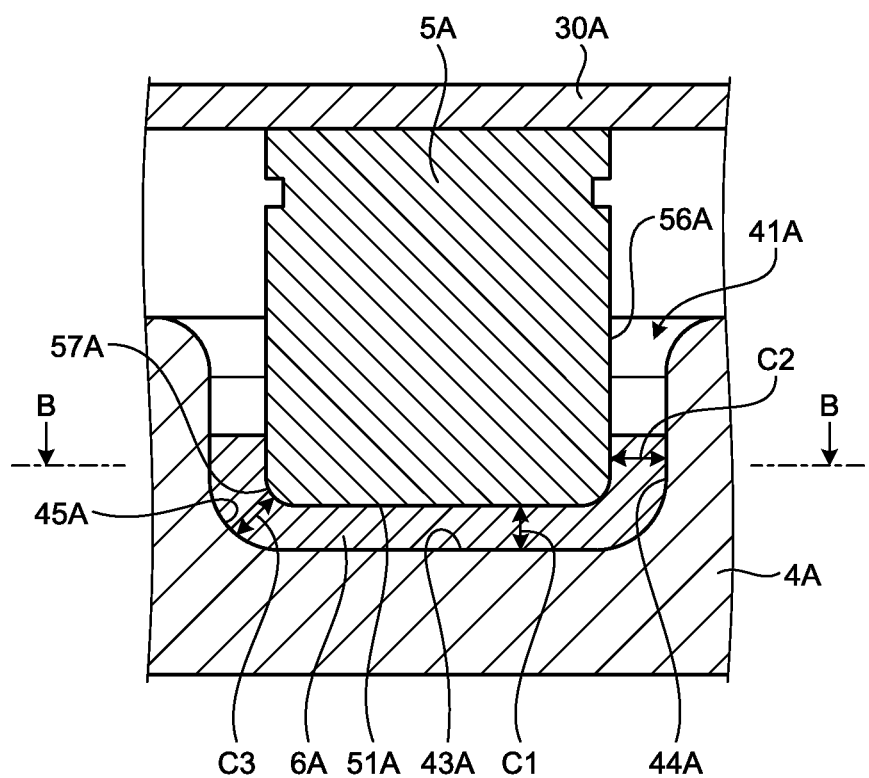
FIG. 25 is an enlarged view of FIG. 24.
Figure 26:
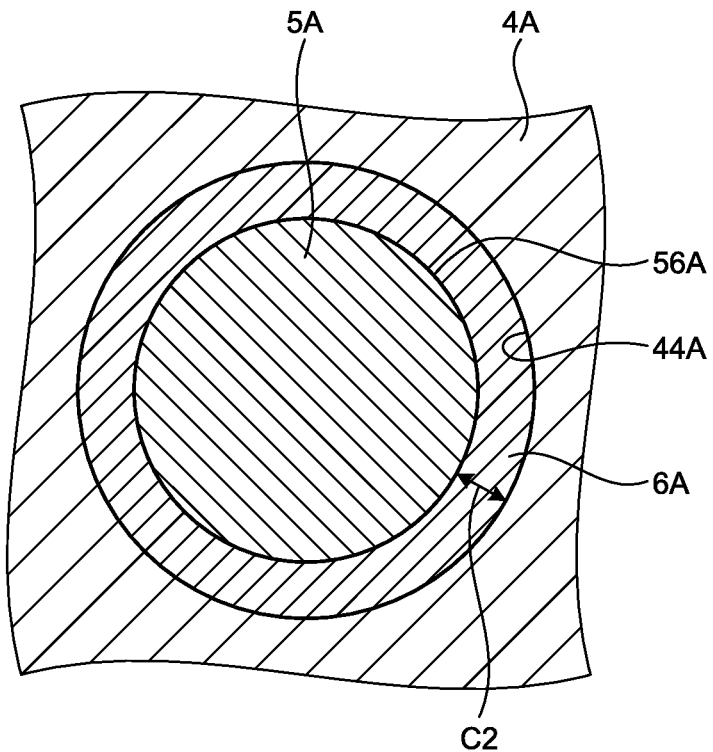
FIG. 26 is a cross-sectional view taken along line B-B in FIG. 25.

FIG. 16 and FIG. 17 are perspective views each illustrating the heat sink according to the second embodiment. FIG. 18 is a front view of the heat sink according to the second embodiment. FIG. 19 is a rear view of the heat sink according to the second embodiment. FIG. 20 is a right side view of the heat sink according to the second embodiment. FIG. 21 is a left side view of the heat sink according to the second embodiment. FIG. 22 is a plan view of the heat sink according to the second embodiment. FIG. 23 is a bottom view of the heat sink according to the second embodiment. FIG. 24 is a cross-sectional view taken along line A-A in FIG. 13. FIG. 25 is an enlarged view of FIG. 24. FIG. 26 is a cross-sectional view taken along line B-B in FIG. 25.

The heat sink 4A is a member configured to dissipate heat generated by the circuit board 3A. For example, the heat sink 4A is formed from metal such as an aluminum alloy by die-casting. For example, the heat sink 4A is mounted on the outer peripheral surface of the electric motor 93. As illustrated in FIG. 16, the heat sink 4A includes an upper stage portion 401A and a lower stage portion 402A. The upper stage portion 401A and the lower stage portion 402A are the surface of the heat sink 4A and are substantially parallel to the substrate 30A. The lower stage portion 402A is closer to the electric motor 93 than the upper stage portion 401A is to the electric motor 93.

As illustrated in FIG. 16, the heat sink 4A includes three recesses 41A in the lower stage portion 402A. The three recesses 41A correspond to the three electrolytic capacitors 5A on a one-to-one basis. Specifically, the three recesses 41A are arranged in the same straight line. An interval between adjacent two recesses 41A is equal to a distance between adjacent two electrolytic capacitors 5A. As illustrated in FIG. 24, a bottom surface 43A of the recess 41A is a flat surface along the substrate 30A. As illustrated in FIG. 24, the circuit board 3A is mounted to the heat sink 4A such that the end surface 51A of the electrolytic capacitor 5A faces the bottom surface 43A of the recess 41A. In this manner, at least a part of the electrolytic capacitor 5A is housed in the recess 41A. Accordingly, the thickness of the ECU 2A can be reduced. As illustrated in FIG. 25, the end surface 51A is along the bottom surface 43A. A width C1 of a gap between the end surface 51A and the bottom surface 43A is preferably constant. In other words, the end surface 51A is preferably parallel to the bottom surface 43A.

As illustrated in FIG. 16, the recess 41A is substantially columnar. Specifically, the recess 41A as seen from a direction perpendicular to the lower stage portion 402A is circular as illustrated in FIG. 18. As illustrated in FIG. 25, the bottom surface 43A of the recess 41A is substantially parallel to the end surface 51A. A side surface 44A of the recess 41A is along the outer peripheral surface 56A of the electrolytic capacitor 5A. The side surface 44A is a cylindrical curved surface. Specifically, as illustrated in FIG. 26, in a cross-section of the electrolytic capacitor 5A and the heat sink 4A cut along a plane parallel to the end surface 51A, the outer peripheral surface 56A and the side surface 44A form into respective circles. For example, in the cross-section in FIG. 26, the outer peripheral surface 56A and the side surface 44A preferably form into respective concentric circles. In other words, a width C2 of a gap between the outer peripheral surface 56A and the side surface 44A is preferably constant.

As illustrated in FIG. 25, the recess 41A includes a concave curved surface 45A that is a curved surface connecting the bottom surface 43A and the side surface 44A. The concave curved surface 45A is a curved surface that is concave with respect to the electrolytic capacitor 5A. In a cross-section including an axis of the electrolytic capacitor 5A (cross-section illustrated in FIG. 25), the concave curved surface 45A forms into an arc. The curvature radius of the arc formed by the concave curved surface 45A is larger than the curvature radius of the arc formed by the convex curved surface 57A of the electrolytic capacitor 5A. For example, in the cross-section illustrated in FIG. 25, the center of the arc formed by the concave curved surface 45A of the recess 41A is preferably the same as the center of the arc formed by the convex curved surface 57A of the electrolytic capacitor 5A. In other words, a width C3 of a gap between the convex curved surface 57A and the concave curved surface 45A illustrated in FIG. 25 is preferably constant.

A heat dissipation material 6A is a material for promoting the transfer of heat generated by the circuit board 3A to the heat sink 4A. The heat dissipation material 6A is, for example, a material obtained by mixing heat conductive filler in silicone polymer. The heat dissipation material 6A is, for example, in a paste form. The viscosity of the heat dissipation material 6A is, for example, about 45 Pa·s. As illustrated in FIG. 24, the heat dissipation material 6A is in contact with the electrolytic capacitor 5A and the inner wall of the recess 41A. More specifically, the heat dissipation material 6A is in contact with the end surface 51A, the convex curved surface 57A, the outer peripheral surface 56A, the bottom surface 43A, the concave curved surface 45A, and the side surface 44A.

The heat dissipation material 6A, which has heat conductivity higher than that of air, is in contact with the electrolytic capacitor 5A and the heat sink 4A, whereby the heat dissipation efficiency is improved as compared with the case where the heat dissipation material 6A is absent. Further, the end surface 51A is not covered with the sleeve 59A, and the heat conductivity of the case 50A is higher than the heat conductivity of the sleeve 59A. Accordingly, the contact of the heat dissipation material 6A with the end surface 51A improves the heat dissipation efficiency, as compared with the case where the heat dissipation material 6A is in contact with only the outer peripheral surface 56A.

A manufacturing error may occur in the axial length and the outer diameter of the electrolytic capacitor 5A. For example, the error in the axial length in the electrolytic capacitor 5A in the second embodiment is about ±0.3 mm or ±0.5 mm, depending on the outer diameter. The error in the outer diameter is about ±0.5 mm. The position of the electrolytic capacitor 5A may deviate from a design position due to a manufacturing error (warpage) in the substrate 30A and an assembly error occurring when the circuit board 3A is mounted to the heat sink 4A.

The width C1 illustrated in FIG. 25 is preferably equal to or more than a predetermined lower limit value (for example, 0.5 mm) and equal to or less than a predetermined upper limit value (for example, 1.5 mm) even when a manufacturing error in the axial length of the electrolytic capacitor 5A, a manufacturing error in the substrate 30A, and an assembly error occur. By setting the width C1 to be equal to or more than the lower limit value, the heat dissipation efficiency is improved because a predetermined amount of the heat dissipation material 6A is easily interposed between the end surface 51A and the bottom surface 43A. By setting the width C1 to be equal to or less than the upper limit value, the amount of the heat dissipation material 6A used for obtaining predetermined heat dissipation efficiency of the electrolytic capacitor 5A is reduced.

The width C2 illustrated in FIG. 25 is preferably equal to or more than a predetermined lower limit value (for example, 0.5 mm) and equal to or less than a predetermined upper limit value (for example, 1.5 mm) even when a manufacturing error in the outer diameter of the electrolytic capacitor 5A and an assembly error occur. By setting the width C2 to be equal to or more than the lower limit value, the heat dissipation efficiency is improved because a predetermined amount of the heat dissipation material 6A is easily interposed between the outer peripheral surface 56A and the side surface 44A. By setting the width C2 to be equal to or less than the upper limit value, the amount of the heat dissipation material 6A used for obtaining predetermined heat dissipation efficiency of the electrolytic capacitor 5A is reduced.

The width C3 illustrated in FIG. 25 is preferably equal to or more than a predetermined lower limit value (for example, 0.5 mm) and equal to or less than a predetermined upper limit value (for example, 1.5 mm) even when manufacturing errors in the axial length and the outer diameter of the electrolytic capacitor 5A, a manufacturing error in the substrate 30A, and an assembly error occur. By setting the width C3 to be equal to or more than the lower limit value, the heat dissipation efficiency is improved because a predetermined amount of the heat dissipation material 6A is easily interposed between the convex curved surface 57A and the concave curved surface 45A. By setting the width C3 to be equal to or less than the upper limit value, the amount of the heat dissipation material 6A used for obtaining predetermined heat dissipation efficiency of the electrolytic capacitor 5A is reduced.

Figure 27:
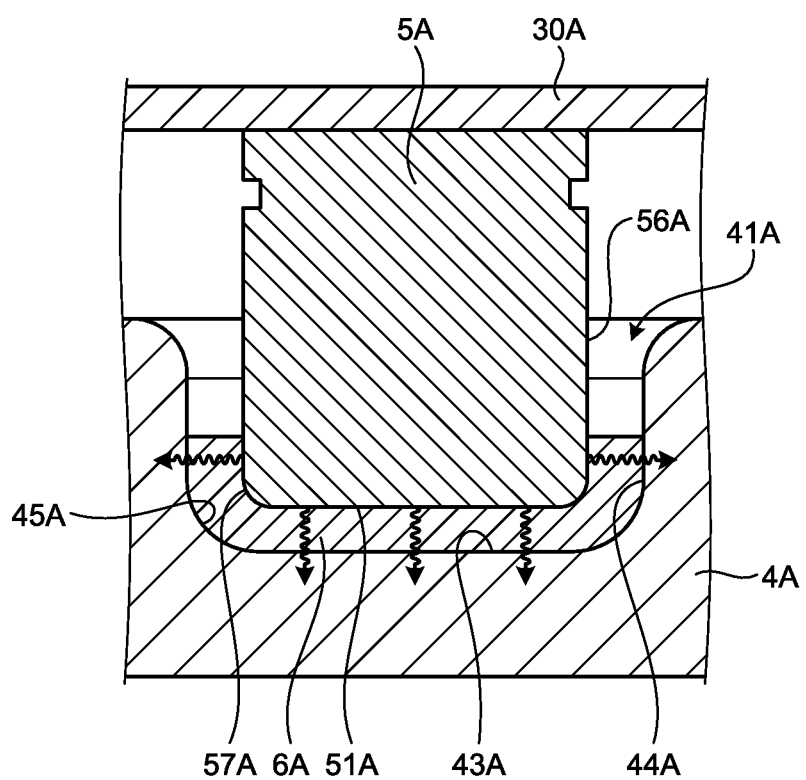
FIG. 27 is a cross-sectional view schematically illustrating heat transfer.
Figure 28:
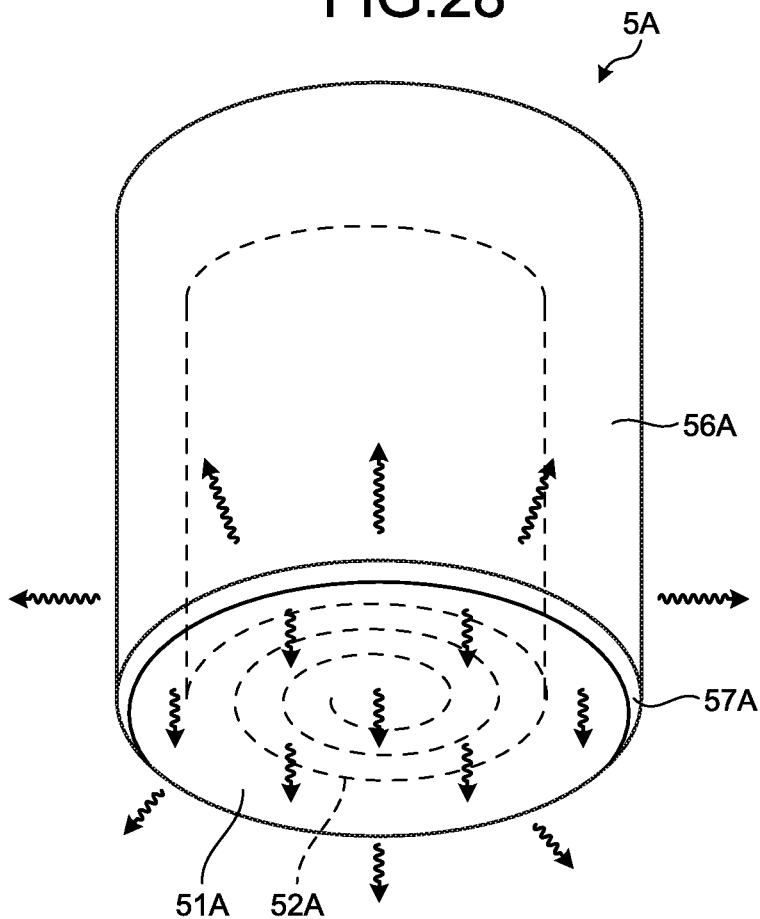
FIG. 28 is a perspective view schematically illustrating heat transfer.

FIG. 27 is a cross-sectional view schematically illustrating heat transfer. FIG. 28 is a perspective view schematically illustrating heat transfer. If the heat dissipation material 6A is in contact with only the outer peripheral surface 56A, heat generated at the outer peripheral part of the element 52A dissipates, but heat generated at the center part of the element 52A hardly dissipates. Furthermore, the contact of the heat dissipation material 6A with only the outer peripheral surface 56A promotes heat dissipation on only one side of the electrolytic capacitor 5A, thereby possibly causing temperature bias inside the electrolytic capacitor 5A. In the second embodiment, on the other hand, as illustrated in FIG. 27 and FIG. 28, the contact of the heat dissipation material 6A with both the end surface 51A and the outer peripheral surface 56A causes heat to be transferred to the heat sink 4A through the entire end surface 51A and the whole circumference of a part of the outer peripheral surface 56A. Consequently, the heat dissipation efficiency of the electrolytic capacitor 5A is improved, and temperature bias inside the electrolytic capacitor 5A is prevented.

Figure 29:
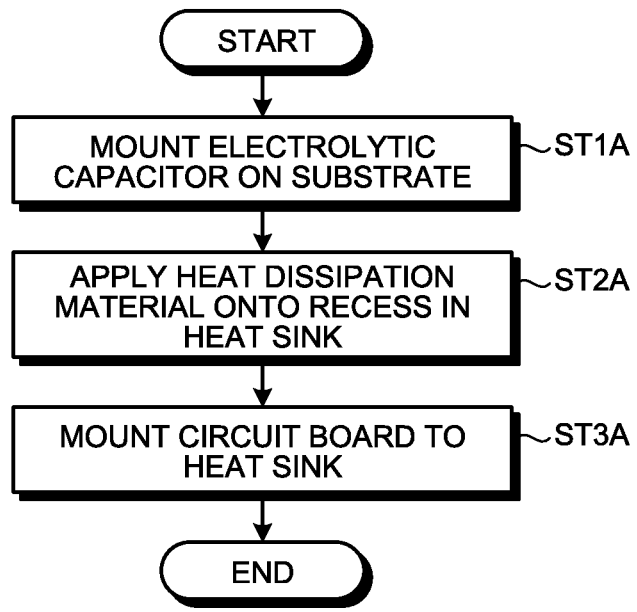
FIG. 29 is a flowchart illustrating a method of manufacturing an electronic control device according to the second embodiment.
Figure 30:
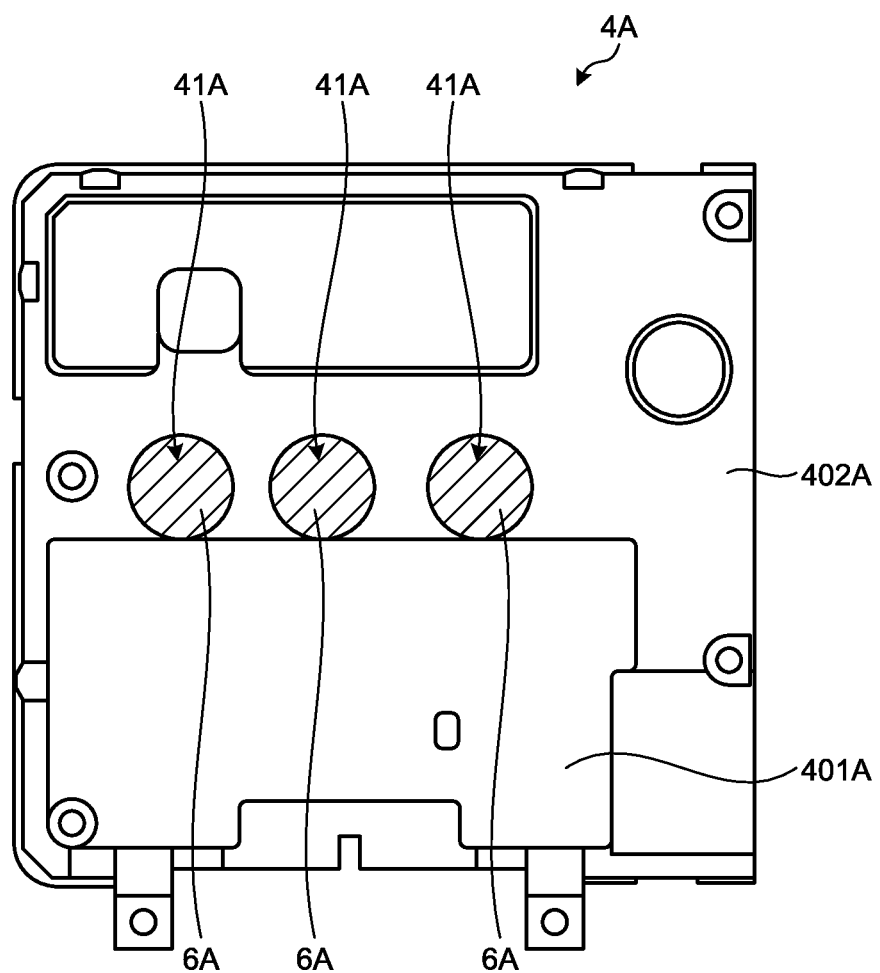
FIG. 30 is a front view of the heat sink in a process of manufacturing an electronic control device according to the second embodiment.
Figure 31:
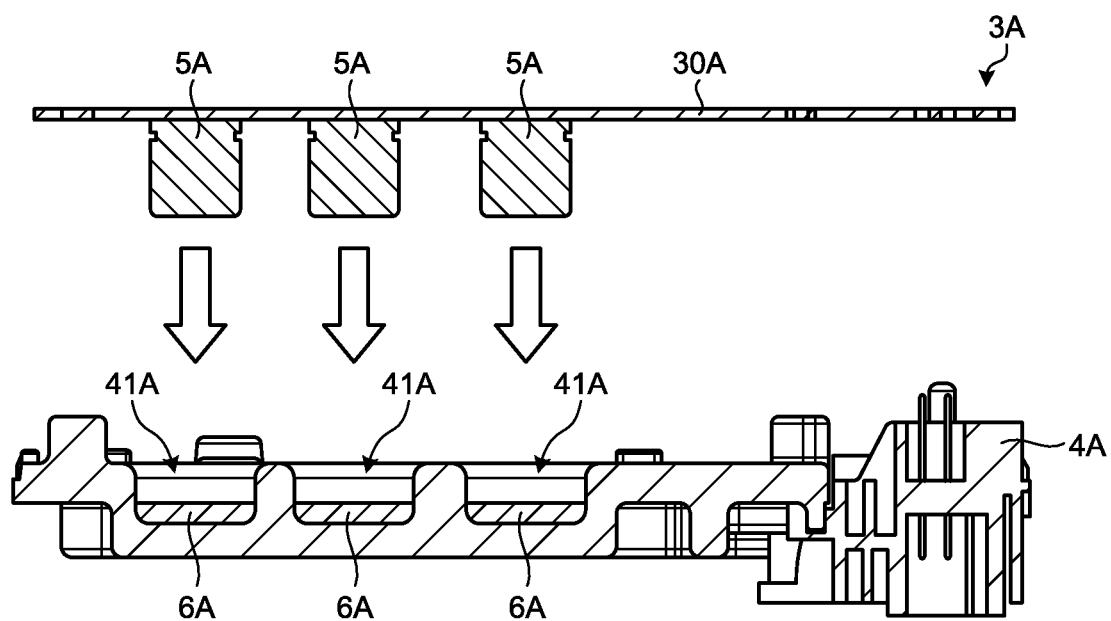
FIG. 31 is a cross-sectional view of the heat sink and the circuit board in the process of manufacturing an electronic control device according to the second embodiment.

FIG. 29 is a flowchart illustrating a method of manufacturing an electronic control device according to the second embodiment. FIG. 30 is a front view of the heat sink in a process of manufacturing an electronic control device according to the second embodiment. FIG. 31 is a cross-sectional view of the heat sink and the circuit board in the process of manufacturing an electronic control device according to the second embodiment.

In a step for assembling the circuit board 3A and the heat sink 4A, first, the electrolytic capacitor 5A is mounted on the substrate 30A (Step ST1A in FIG. 29). The lead wire 54A of the electrolytic capacitor 5A is connected to the substrate 30A by solder.

Following Step ST1A, as illustrated in FIG. 30, the heat dissipation material 6A is applied on the bottom surface 43A of the heat sink 4A (Step ST2A in FIG. 29). For example, the heat dissipation material 6A is applied onto the entire bottom surface 43A. The application amount of the heat dissipation material 6A is adjusted such that the heat dissipation material 6A comes into contact with the entire end surface 51A and a part of the outer peripheral surface 56A when the circuit board 3A is mounted to the heat sink 4A. Specifically, the volume of the heat dissipation material 6A applied onto the bottom surface 43A is larger than the product of the area of the bottom surface 43A and the width C1 illustrated in FIG. 25. Step ST2A may be performed before Step ST1A.

Following Step ST2A, as illustrated in FIG. 31, the circuit board 3A is mounted to the heat sink 4A (Step ST3A in FIG. 29). For example, the circuit board 3A is fixed to the heat sink 4A by screws. After that, the cover is mounted to the heat sink 4A so as to cover the circuit board 3A. The ECU 2A is then mounted to the outer peripheral surface of the electric motor 93. Wiring (harness) connected to a connector provided to the ECU 2A is connected to the electric motor 93.

The electrolytic capacitor 5A is not necessarily required to have the convex curved surface 57A. In other words, the end surface 51A may be directly continuous to the outer peripheral surface 56A. In such a case, the recess 41A is not necessarily required to have the concave curved surface 45A.

Preferably, each of the width C1, the width C2, and the width C3 illustrated in FIG. 25 is constant, but the widths are not necessarily required to be completely constant. In other words, each of the width C1, the width C2, and the width C3 is preferably substantially constant. For example, the position of the electrolytic capacitor 5A may deviate from an ideal position due to assembly errors. As a result, the actual width C1, width C2, and width C3 may fluctuate to no small extent. Even when the width C1, the width C2, and the width C3 each fluctuate in the range of error, the width C1, the width C2, and the width C3 can be each regarded as substantially constant.

As described above, in the electronic control device (ECU 2A) in the second embodiment, the side surface 44A of the recess 41A is along the outer peripheral surface 56A of the electrolytic capacitor 5A. The heat dissipation material 6A is in contact with the end surface 51A, the outer peripheral surface 56A, the bottom surface 43A, and the side surface 44A.

With this configuration, heat generated by the electrolytic capacitor 5A is transferred to the heat sink 4A through the end surface 51A. Accordingly, for example, as compared with the case where the heat dissipation material 6A is in contact with only the outer peripheral surface of the electrolytic capacitor 5A covered with the sleeve 59A, the amount of heat transferred to the heat sink 4A tends to be large. Consequently, the electronic control device (ECU 2A) according to the second embodiment can improve heat dissipation efficiency of the electrolytic capacitor 5A.

Furthermore, the contact of the heat dissipation material 6A with the end surface 51A and the outer peripheral surface 56A allows heat of the electrolytic capacitor 5A to dissipate in multiple directions. Consequently, the heat dissipation efficiency of the electrolytic capacitor 5A is further improved. The side surface 44A of the recess 41A being along the outer peripheral surface 56A of the electrolytic capacitor 5A easily makes the thickness of the heat dissipation material 6A uniform. Consequently, a fluctuation in heat dissipation efficiency due to the difference in position among the electrolytic capacitors 5A is reduced. As a result, the heat dissipation efficiency of the electrolytic capacitor 5A is easily improved, and hence the amount of the heat dissipation material 6A used for obtaining the predetermined heat dissipation efficiency is reduced.

In the electronic control device (ECU 2A), the heat sink 4A includes the concave curved surface 45A that is a curved surface connecting the bottom surface 43A and the side surface 44A. Consequently, when the electrolytic capacitor 5A is housed in the recess 41A, the heat dissipation material 6A more easily moves toward an edge of the recess 41A (toward an inlet of the recess 41A).

In the electronic control device (ECU 2A), in a cross-section of the electrolytic capacitor 5A and the heat sink 4A cut along a plane parallel to the end surface 51A, the width C2 of the gap between the outer peripheral surface 56A and the side surface 44A is constant. With this configuration, because the thickness of the heat dissipation material 6A is made uniform, heat is transmitted to the heat sink 4A uniformly over the entire circumference of the electrolytic capacitor 5A. As a result, the heat dissipation efficiency of the electrolytic capacitor 5A is more easily improved, and hence the amount of the heat dissipation material 6A used for obtaining predetermined heat dissipation efficiency is further reduced.

Modification of Second Embodiment

Figure 32:
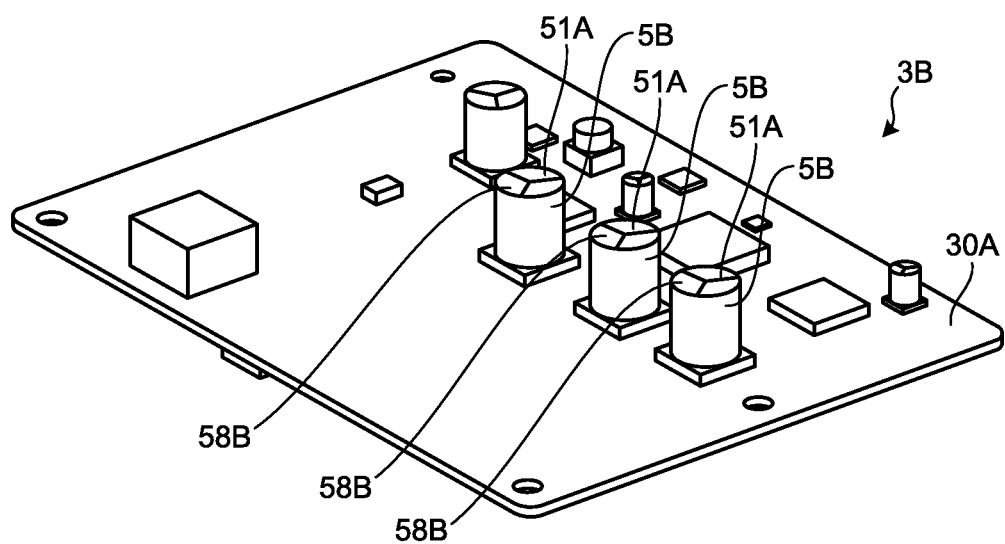
FIG. 32 is a perspective view of a circuit board according to a modification of the second embodiment.

FIG. 32 is a perspective view of a circuit board according to a modification of the second embodiment. The same components as those described in the above-mentioned embodiments are denoted by the same reference numerals, and overlapping descriptions are omitted.

A circuit board 3B according to the modification of the second embodiment includes an electrolytic capacitor 5B different from the above-mentioned electrolytic capacitor 5A. The electrolytic capacitor 5B includes an explosion-proof valve 58B on the end surface 51A. The explosion-proof valve 58B is, for example, a substantially Y-shaped cut (slit) provided in the end surface 51A. The explosion-proof valve 58B is opened when the element 52A and the electrolytic solution 53A excessively expand.

With this configuration, the heat dissipation material 6A covers the explosion-proof valve 58B. Because the heat dissipation material 6A has adhesion properties, even when the explosion-proof valve 58B is opened due to expansion of the electrolytic solution 53A, the heat dissipation material 6A covers the end surface 51A. Consequently, the electronic control device (ECU 2A) can suppress scattering of the electrolytic solution 53A when the explosion-proof valve 58B is opened due to the expansion of the electrolytic solution 53A.

REFERENCE SIGNS LIST 2, 2A ECU (electronic control device)
21 motor driving control unit
22 inverter
23 motor relay circuit
3, 3A, 3B circuit board
30, 30A substrate
4, 4A heat sink
41, 41A recess
42 partition wall
43, 43A bottom surface
44A side surface
45A concave curved surface
401, 401A upper stage portion
402, 402A lower stage portion
5, 5A, 5B electrolytic capacitor
50, 50A case
51, 51A end surface
52, 52A element
53, 53A electrolytic solution
54, 54A lead wire
55, 55A sealing material
56A outer peripheral surface
57A convex curved surface
58, 58B explosion-proof valve
59, 59A sleeve
6, 6A heat dissipation material
80 steering device
81 steering wheel
82 steering shaft
82a input shaft
82b output shaft
83 steering force assist mechanism
84 universal joint
85 lower shaft
86 universal joint
87 pinion shaft
88 steering gear
88a pinion
88b rack
89 tie rod
92 reducer
93 electric motor
94 torque sensor
95 vehicle speed sensor
98 ignition switch
99 power supply device

The invention claimed is:

1. An electronic control device, comprising:
  a circuit board including:
    a substrate on which electronic components constituting a control circuit and electronic components constituting a power supply circuit are disposed; and
    an electrolytic capacitor connected to the substrate;
  a heat sink including
    a step,
    an upper stage portion disposed in one side of the step,
    a lower stage portion disposed in the other side of the step, and
    a recess disposed in the lower stage portion to house the electrolytic capacitor;
  heat dissipation material provided in the recess; and
  a screw to fix the substrate to the heat sink,
  wherein
  the recess has a side surface along an outer peripheral surface of the electrolytic capacitor,
  the heat dissipation material is in contact with:
    the outer peripheral surface of the electrolytic capacitor;
    the end surface of the electrolytic capacitor, the end surface facing a bottom surface of the recess;
    the bottom surface of the recess;
    the side surface of the recess; and
    an entire area of a concave curved surface of the recess, the concave curved surface being a curved surface connecting the bottom surface and the side surface, and the recesses and the screw are aligned along a same line.

2. The electronic control device according to claim 1, wherein the heat dissipation material is in contact with the entire end surface of the electrolytic capacitor.

3. The electronic control device according to claim 1, wherein, in a cross-section of the electrolytic capacitor and the heat sink cut along a plane parallel to the end surface, a width of a gap between the outer peripheral surface and the side surface is constant.

4. The electronic control device according to claim 1, wherein the electrolytic capacitor includes an explosion-proof valve on the end surface.

5. A steering device, comprising:
  the electronic control device according to claim 1; and
  an electric motor controlled by the electronic control device to generate assist steering torque.

6. The electronic control device according to claim 1, wherein
  the heat dissipation material being in a paste form is disposed between the electrolytic capacitor and the recess such that the heat dissipation material has:
    a first width between the bottom surface of the recess and end surface of the electrolytic capacitor;
    a second width between the side surface of the recess and the outer peripheral surface of the electrolytic capacitor; and
    a third width between the concave curved surface of the recess and a convex curved surface of the electrolytic capacitor, and each of the first width, the second width, and the third width is in a range between 0.5 to 1.5 mm.

* * * * *